(12) United States Patent
Tian et al.

(10) Patent No.: US 12,361,889 B2
(45) Date of Patent: Jul. 15, 2025

(54) DISPLAY SUBSTRATE, DISPLAY PANEL, DISPLAY APPARATUS, AND METHOD OF FABRICATING DISPLAY SUBSTRATE

(71) Applicant: BOE Technology Group Co., Ltd., Beijing (CN)

(72) Inventors: Hongwei Tian, Beijing (CN); Yanan Niu, Beijing (CN); Chunyang Wang, Beijing (CN); Dong Li, Beijing (CN); Zheng Liu, Beijing (CN); Shuai Zhang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 598 days.

(21) Appl. No.: 17/589,810

(22) Filed: Jan. 31, 2022

(65) Prior Publication Data

US 2022/0157919 A1 May 19, 2022

Related U.S. Application Data

(63) Continuation-in-part of application No. 16/493,096, filed as application No. PCT/CN2019/079016 on Mar. 21, 2019, now Pat. No. 11,380,715.

(30) Foreign Application Priority Data

Oct. 15, 2018 (CN) .......................... 201811194732.3

(51) Int. Cl.
*H10K 59/131* (2023.01)
*G09G 3/3266* (2016.01)
(Continued)

(52) U.S. Cl.
CPC ......... *G09G 3/3266* (2013.01); *H10K 50/865* (2023.02); *H10K 59/1213* (2023.02);
(Continued)

(58) Field of Classification Search
CPC ............... H01L 27/3262; H01L 27/124; H01L 27/3276; H01L 2227/323; H01L 27/1255;
(Continued)

(56) References Cited

U.S. PATENT DOCUMENTS 9,412,760 B1 8/2016 Bai et al.
2017/0017129 A1* 1/2017 Zhao ................. G02F 1/136204
(Continued)

FOREIGN PATENT DOCUMENTS

CN 104965368 A 10/2015
CN 107093618 A 8/2017
(Continued)

OTHER PUBLICATIONS

International Search Report & Written Opinion mailed Jul. 19, 2019, regarding PCT/CN2019/079016.
(Continued)

*Primary Examiner* — Tony Tran
(74) *Attorney, Agent, or Firm* — Intellectual Valley Law, P.C.

(57) ABSTRACT

A display substrate having a display area and a gate-on-array (GOA) area outside the display area is provided. The display substrate includes a base substrate; a plurality of GOA signal lines on the base substrate and in the GOA area; and a first signal line in the GOA area, at least a portion of the first signal line being on a side of the plurality of GOA signal lines away from the base substrate. An orthographic projection of the first signal line on the base substrate at least partially covers an orthographic projection of at least one of a first clock signal line, a second clock signal line, a start signal line, a high voltage power line, or a low voltage power line on the base substrate.

17 Claims, 14 Drawing Sheets

(51) Int. Cl.
*H10K 50/86* (2023.01)
*H10K 59/121* (2023.01)
*H10K 59/80* (2023.01)

(52) U.S. Cl.
CPC ....... *H10K 59/131* (2023.02); *H10K 59/8792* (2023.02); *G09G 2310/0286* (2013.01)

(58) Field of Classification Search
CPC ........... H01L 29/78633; H01L 27/1288; H01L 27/1222; H01L 27/127
See application file for complete search history.

(56) References Cited

U.S. PATENT DOCUMENTS

2019/0073976 A1    3/2019   Yeh et al.
2019/0288056 A1    9/2019   Xiao et al.
2020/0074912 A1*   3/2020   Kitsomboonloha ........................ G09G 3/2092

FOREIGN PATENT DOCUMENTS

CN    107121852 A    9/2017
CN    107623023 A    1/2018

OTHER PUBLICATIONS

First Office Action in the Chinese Patent Application No. 201811194732.3, dated Nov. 2, 2020; English translation attached.
Second Office Action in the Chinese Patent Application No. 201811194732.3, dated Jun. 1, 2021; English translation attached.
Restriction Requirement in the U.S. Appl. No. 16/493,096, dated Dec. 9, 2021.
Response to Restriction Requirement in the U.S. Appl. No. 16/493,096, dated Jan. 13, 2022.
Non-Final Office Action in the U.S. Appl. No. 16/493,096, dated Feb. 25, 2022.
Response to Non-Final Office Action in the U.S. Appl. No. 16/493,096, dated Mar. 21, 2022.
Notice of Allowance in the U.S. Appl. No. 16/493,096, dated Apr. 27, 2022.

* cited by examiner

Forming a light shielding layer on a base substrate

Forming an insulating layer on a side of the light shielding layer away from the base substrate Forming a plurality of first vias extending through the insulating layer in the GOA area Forming a GOA signal line on a side of the insulating layer away from the light shielding layer

DISPLAY SUBSTRATE, DISPLAY PANEL, DISPLAY APPARATUS, AND METHOD OF FABRICATING DISPLAY SUBSTRATE

CROSS-REFERENCE TO RELATED APPLICATION

This application is a continuation of U.S. application Ser. No. 16/493,096, filed Mar. 21, 2019, which is a national stage application under 35 U.S.C. § 371 of International Application No. PCT/CN2019/079016, filed Mar. 21, 2019, which claims priority to Chinese Patent Application No. 201811194732.3, filed Oct. 15, 2018. Each of the forgoing applications is herein incorporated by reference in its entirety for all purposes.

TECHNICAL FIELD

The present invention relates to display technology, more particularly, to a display substrate, a display panel, a display apparatus, and a method of fabricating a display substrate thereof.

BACKGROUND

The organic light-emitting diode display (OLED) is an important technology in display industry. The organic light-emitting diode display has the advantages of low power consumption, high color saturation, wide viewing angle, thin thickness, and high flexibility. The OLED technology has been widely used in a smart phone, a tablet computer, or a television, especially in fabricating a flexible display device.

As the resolution of a display panel increases (e.g., in Full High Definition (FHD), Quarter High Definition (QHD)), the density of the integrated circuits increases correspondingly, therefore, it becomes more and more difficult to accommodate the more and more complicated integrated circuits in the margins of a display panel. Accordingly, the double-source/drain-layer technology has been used to reduce the margin of a display panel.

SUMMARY

In one aspect, the present invention provides a display substrate having a display area and a gate-on-array (GOA) area outside the display area, comprising a base substrate; a plurality of GOA signal lines on the base substrate and in the GOA area; and a first signal line in the GOA area, at least a portion of the first signal line being on a side of the plurality of GOA signal lines away from the base substrate; wherein the plurality of GOA signal lines comprises a first clock signal line, a second clock signal line, a start signal line, a high voltage power line, and a low voltage power line; an orthographic projection of the first signal line on the base substrate at least partially covers an orthographic projection of at least one of the first clock signal line, the second clock signal line, the start signal line, the high voltage power line, or the low voltage power line on the base substrate.

Optionally, the orthographic projection of the first signal line on the base substrate at least partially covers a combination of orthographic projections of the first clock signal line, the second clock signal line, the start signal line, the high voltage power line, and the low voltage power line on the base substrate.

Optionally, the display substrate further comprises a plurality of drive circuits in the GOA area; wherein the plurality of drive circuits comprise at least one of a gate drive circuit configured to transmit gate scanning signals to gate electrodes of data write transistors in a pixel driving circuits in a display area, a light emission control drive circuit configured to transmit light emission control signals to gate electrodes of light emission control transistors in the pixel driving circuits in the display area, and a reset control drive circuit configured to transmit reset control signals to reset transistors in the pixel driving circuits in the display area; and the orthographic projection of the first signal line on the base substrate at least partially covers an orthographic projection of the light emission control drive circuit on the base substrate.

Optionally, the orthographic projection of the first signal line on the base substrate covers an orthographic projection of at least one light emission control shift register of the light emission control drive circuit on the base substrate.

Optionally, the orthographic projection of the first signal line on the base substrate covers an orthographic projection of at least one light emission control shift register unit of the light emission control drive circuit on the base substrate, and covers an orthographic projection of at least one shift register unit of the gate drive circuit.

Optionally, the display substrate further comprises a plurality of pixel driving circuits, a respective pixel driving circuit of the plurality of pixel driving circuit comprising a thin film transistor, a planarization layer, and a relay electrode; wherein the planarization layer is on a side of the thin film transistor away from the base substrate, covering the thin film transistor; the relay electrode is on a side of the planarization layer away from the base substrate; the thin film transistor comprises an active layer on the base substrate, a gate electrode on a side of the active layer away from the base substrate, a first electrode and a second electrode on a side of the gate electrode away from the base substrate, the relay electrode being electrically connected to one of the first electrode and the second electrode through a via extending through the planarization layer; and the first signal line is in a same layer as the relay electrode.

Optionally, the orthographic projection of the first signal line on the base substrate further at least partially covers an orthographic projection of the gate drive circuit on the base substrate.

Optionally, the display substrate further comprises a light shielding layer on the base substrate; an insulating layer on a side of the light shielding layer away from the base substrate; wherein the GOA signal line on a side of the insulating layer away from the light shielding layer, and is connected electrically in parallel with a first part of the light shielding layer, the first part being in the GOA area; wherein the display substrate comprises a plurality of first vias extending through the insulating layer in the GOA area; and the GOA signal line is electrically connected to the first part of the light shielding layer through the plurality of first vias respectively, thereby connecting the GOA signal line and the first part of the light shielding layer electrically in parallel.

Optionally, the display substrate further comprises a plurality of thin film transistors in the display area; wherein the light shielding layer further comprises a plurality of light shielding blocks on the base substrate and in the display area, a respective one of the plurality of light shielding blocks on a side of an active layer of the plurality of thin film transistors closer to the base substrate for shielding light from irradiating on the active layer; and the first part of the light shielding layer and the plurality of light shielding blocks are in a same layer and comprise a same material.

Optionally, the display substrate further comprises a planarization layer on a side of the GOA signal line away from the base substrate; and a first signal line in the GOA area and on a side of the planarization layer away from the base substrate, and is connected electrically in parallel with a second part of the light shielding layer in the GOA area, the second part spaced apart from the first part; wherein the display substrate comprises a plurality of second vias extending through the insulating layer and the planarization layer in the GOA area; and the first signal line is electrically connected to the second part of the light shielding layer through the plurality of second vias respectively, thereby connecting the first signal line and the second part of the light shielding layer electrically in parallel.

Optionally, the display substrate comprises at least one opening in the second part of the light shielding layer.

Optionally, the first part and the second part of the light shielding layer, and the plurality of light shielding blocks are in a same layer and comprise a same material.

Optionally, the display substrate further comprises a second signal line in the display area and on a side of the planarization layer away from the base substrate, and is connected electrically in parallel with a third part of the light shielding layer in the display area, the third part spaced apart from the first part and spaced apart from the second part; and a plurality of third vias extending through the insulating layer and the planarization layer in the display area; wherein the second signal line is electrically connected to the third part of the light shielding layer through the plurality of third vias respectively, thereby connecting the second signal line and the third part of the light shielding layer electrically in parallel.

Optionally, the first part, the second part, and the third part of the light shielding layer, and the plurality of light shielding blocks are in a same layer and comprise a same material.

Optionally, an orthographic projection of the respective one of the plurality of light shielding blocks on the base substrate covers an orthographic projection of the active layer of the plurality of thin film transistors on the base substrate.

Optionally, the display substrate further comprises an opening in the respective one of the plurality of light shielding blocks allowing light passing through to a photosensor for fingerprint detection.

Optionally, the GOA signal line is selected from a group consisting of a clock signal line, a start signal line, a high voltage power line, and a low voltage power line.

Optionally, the first signal line is a power signal line.

Optionally, the second signal line is a ground voltage line.

Optionally, the display substrate comprises at least one opening in the first part of the light shielding layer.

In another aspect, the present invention provides a display panel, comprising the display substrate described herein or fabricated by a method described herein, and one or more integrated circuits connected to the display substrate.

In another aspect, the present invention provides a display apparatus, comprising the display panel described herein.

In another aspect, the present invention provides a method of fabricating a display substrate having a display area and a gate-on-array (GOA) area outside the display area, forming a plurality of GOA signal lines on a base substrate and in the GOA area; and forming a first signal line in the GOA area, at least a portion of the first signal line being on a side of the plurality of GOA signal lines away from the base substrate; wherein forming the plurality of GOA signal lines comprises forming a first clock signal line, forming a second clock signal line, forming a start signal line, forming a high voltage power line, and forming a low voltage power line; and an orthographic projection of the first signal line on the base substrate at least partially covers an orthographic projection of at least one of the first clock signal line, the second clock signal line, the start signal line, the high voltage power line, or the low voltage power line on the base substrate.

Optionally, the method further comprises forming a plurality of drive circuits in the GOA area; wherein forming the plurality of drive circuits comprise forming at least one of a gate drive circuit configured to transmit gate scanning signals to gate electrodes of data write transistors in a pixel driving circuits in a display area, a light emission control drive circuit configured to transmit light emission control signals to gate electrodes of light emission control transistors in the pixel driving circuits in the display area, and a reset control drive circuit configured to transmit reset control signals to reset transistors in the pixel driving circuits in the display area; and the orthographic projection of the first signal line on the base substrate at least partially covers an orthographic projection of the light emission control drive circuit on the base substrate.

Optionally, the method further comprises forming a light shielding layer on the base substrate; forming an insulating layer on a side of the light shielding layer away from the base substrate; wherein the GOA signal line is formed on a side of the insulating layer away from the light shielding layer, the GOA signal line formed to be connected electrically in parallel with a first part of the light shielding layer, the first part being in the GOA area; and forming a plurality of first vias extending through the insulating layer in the GOA area; wherein the GOA signal line is electrically connected to the first part of the light shielding layer through the plurality of first vias respectively, thereby connecting the GOA signal line and the first part of the light shielding layer electrically in parallel.

Optionally, the method further comprises forming a plurality of thin film transistors in the display area; wherein forming the light shielding layer further comprises forming a plurality of light shielding blocks on the base substrate and in the display area, a respective one of the plurality of light shielding blocks formed on a side of an active layer of the plurality of thin film transistors closer to the base substrate for shielding light from irradiating on the active layer; and the first part of the light shielding layer and the plurality of light shielding blocks are formed in a same layer using a same material and a single mask plate.

Optionally, the method further comprises forming a planarization layer on a side of the GOA signal line away from the base substrate; forming a first signal line in the GOA area and on a side of the planarization layer away from the base substrate, the first signal line formed to be connected electrically in parallel with a second part of the light shielding layer in the GOA area, the second part spaced apart from the first part; and forming a plurality of second vias extending through the insulating layer and the planarization layer in the GOA area; wherein the first signal line is formed to be electrically connected to the second part of the light shielding layer through the plurality of second vias respectively, thereby connecting the first signal line and the second part of the light shielding layer electrically in parallel.

Optionally, the method further comprises forming a second signal line in the display area and on a side of the planarization layer away from the base substrate, the second signal line formed to be connected electrically in parallel with a third part of the light shielding layer in the display area, the third part spaced apart from the first part and spaced apart from the second part; and forming a plurality of third vias extending through the insulating layer and the planarization layer in the display area; wherein the second signal line is formed to be electrically connected to the third part of the light shielding layer through the plurality of third vias respectively, thereby connecting the second signal line and the third part of the light shielding layer electrically in parallel.

Optionally, the first part, the second part, and the third part of the light shielding layer, and the plurality of light shielding blocks are formed in a same layer using a same material and a single mask plate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
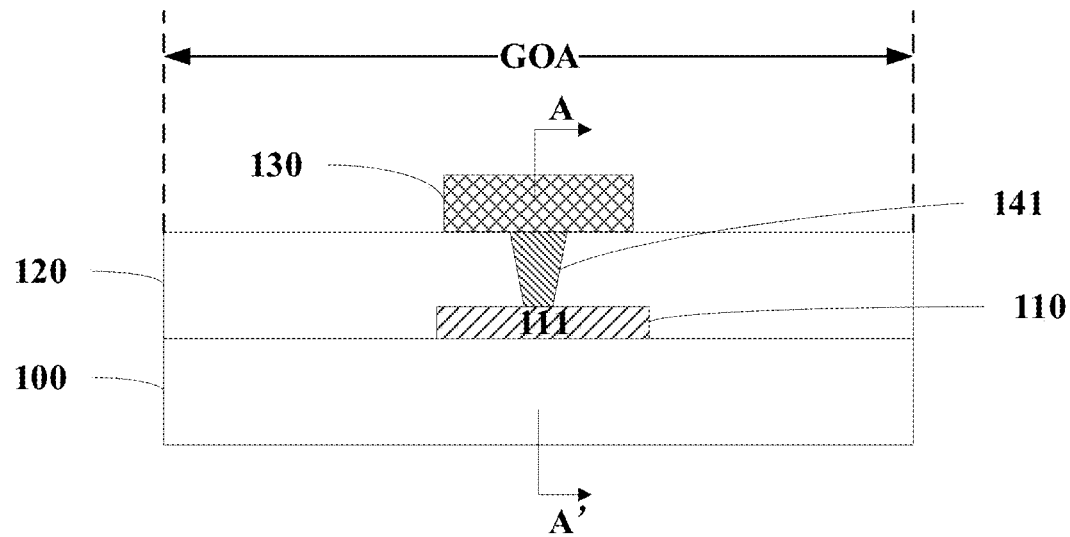
FIG. 1 is a cross-sectional view of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a display substrate, a signal line (e.g., GOA signal line) may generate heat when current go through the signal line. The present disclosure provides, inter alia, a display substrate, a display panel, a display apparatus, and a method of fabricating a display substrate thereof that substantially obviate one or more of the problems due to limitations and disadvantages of the related art. In one aspect, the present disclosure provides a display substrate having a display area and a gate-on-array (GOA) area outside the display area. Optionally, the display substrate includes a base substrate; a light shielding layer on the base substrate; an insulating layer on a side of the light shielding layer away from the base substrate; a GOA signal line on a side of the insulating layer away from the light shielding layer. Optionally, the GOA signal line is connected electrically in parallel with a first part of the light shielding layer. Optionally, the first part of the light shielding layer is in the GOA area. Optionally, the display substrate includes a plurality of first vias extending through the insulating layer in the GOA area. Optionally, the GOA signal line is electrically connected to the first part of the light shielding layer through the plurality of first vias respectively, thereby connecting the GOA signal line and the first part of the light shielding layer electrically in parallel.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

As used herein the term "gate-on-array area" refers to an area of a display substrate (e.g., an opposing substrate or an array substrate) in a display panel where a gate-on-array is provided. The gate-on-array area is in the peripheral area.

FIG. 1 is a cross-sectional view of a display substrate in some embodiments according to the present disclosure. Referring to FIG. 1, in some embodiments, a display substrate having a display area and a gate-on-array (GOA) area outside the display area, includes a base substrate 100. Optionally, the base substrate 100 is a flexible base substrate. Optionally, the base substrate 100 is a rigid base substrate.

In some embodiments, the display substrate further includes a light shielding layer 110 on the base substrate 100. Optionally, the light shielding layer 110 includes a first part 111. Optionally, the light shielding layer 110 is made of a conductive material. Various appropriate conductive materials may be used for making the light shielding layer 110. Examples of conducive materials suitable for making the light shielding layer 110 include, but are not limited to various metals, and various alloys.

In some embodiments, the display substrate further includes an insulating layer 120 on a side of the light shielding layer 110 away from the base substrate 100. Various appropriate materials may be used for forming the insulating layer 120. Examples of materials suitable for forming the insulating layer 120 includes, but are not limited to, silicon oxide, and silicon nitride.

In some embodiments, the display substrate further includes a signal line on a side of the insulating layer 120 away from the light shielding layer 110. Optionally, the signal line is a GOA signal line 130. Optionally, the GOA signal line 130 is connected electrically in parallel with the first part 111 of the light shielding layer 110. Optionally, the first part 111 of the light shielding layer 110 is in the GOA area.

In some embodiments, the display substrate includes a plurality of first vias 141 extending through the insulating layer 120 in the GOA area. Optionally, the GOA signal line 130 is electrically connected to the first part 111 of the light shielding layer 110 through the plurality of first vias 141, respectively, to connect the GOA signal line 130 and the first part 111 of the light shielding layer 110 electrically in parallel. By electrically connecting the GOA signal line 30 in parallel with the first part 111 of the light shielding layer 110, the resistance of a combination of the GOA signal line 30 and the first part 111 of the light shielding layer 110 is less than a sum of a resistance of the GOA signal line 130 and a resistance of the first part 111 of the light shielding layer 110.

Figure 2:
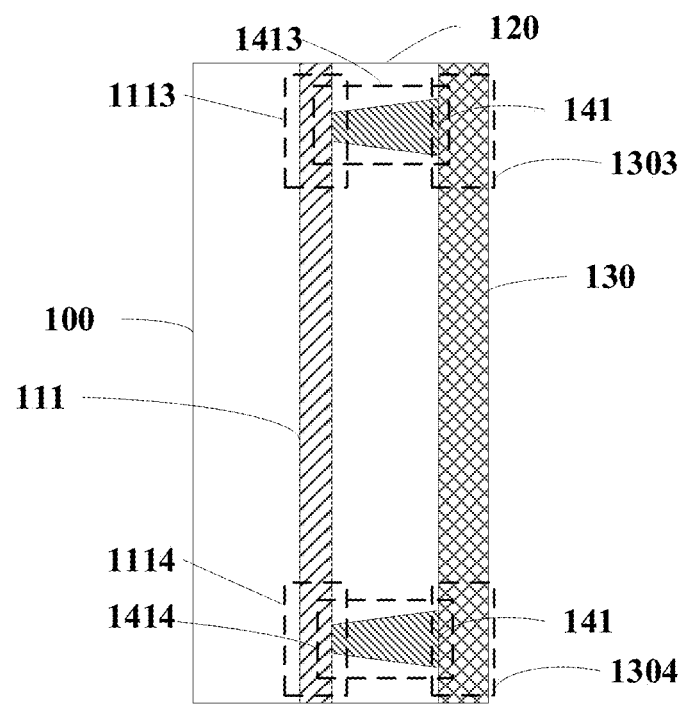
FIG. 2 is a cross-sectional view of the display substrate along line A-A' in FIG. 1.

FIG. 2 is a cross-sectional view of the display substrate along line A-A' in FIG. 1. Referring to FIG. 2, the display substrate includes a plurality of first vias 141 extending through the insulating layer 120. FIG. 2 shows two vias of the plurality of first vias 141. Optionally, a conductive material is filled into the plurality of first vias 141. For example, the conductive material filled in the plurality of first vias 141 is a metallic material.

Optionally, the GOA signal line 130 is electrically connected to the first part 111 of the light shielding layer 110 through at least two vias of the plurality of first vias 141 to connect the GOA signal line 130 and the first part 111 of the light shielding layer 110 electrically in parallel. Optionally, one portion of the GOA signal line 130 is electrically connected to one portion of the first part 111 of the light shielding layer 110, another portion of the GOA signal line 130 is electrically connected to another portion of the first part 111 of the light shielding layer 110.

For example, a first portion 1303 of the GOA signal line 130 is electrically connected to a second portion 1113 of first part 111 of the light shielding layer 110 through a first via 1413 of the plurality of first vias 141 to connect the GOA signal line 130 and the first part 111 of the light shielding layer 110 electrically in parallel. A third portion 1304 of the GOA signal line 130 is electrically connected to a fourth portion 1114 of the first part 111 of the light shielding layer 110 through a second via 1414 of the plurality of first vias 141 to connect the GOA signal line 130 and the first part 111 of the light shielding layer 110 electrically in parallel.

Optionally, the number of the plurality of first vias 141 is more than two. Optionally, in order for the GOA signal line 130 and the first part 111 of the light shielding layer 110 electrically connecting in parallel with each other, three or more vias of the plurality of first vias 141 are provided for the GOA signal line 130 and the first part 111 of the light shielding layer 110 electrically connecting in parallel with each other.

In some embodiments, the GOA signal line 130 is selected from a group consisting of a clock signal line, a start signal line, a high voltage power line, and a low voltage power line.

Figure 3:
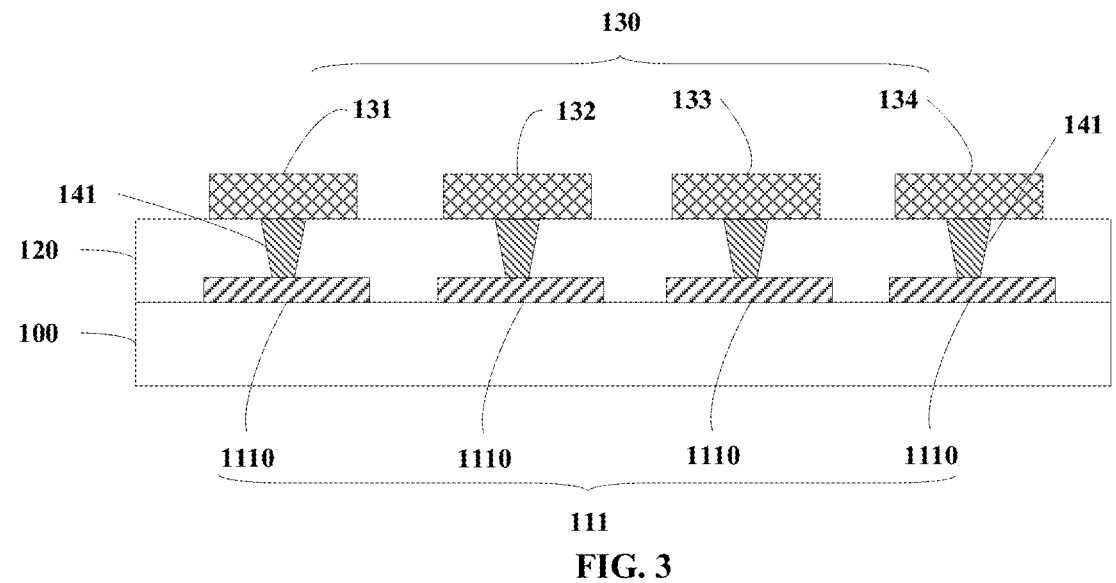
FIG. 3 is a cross-sectional view of a display substrate in some embodiments according to the present disclosure.

FIG. 3 is a cross-sectional view of a display substrate in some embodiments according to the present disclosure. Referring to FIG. 3, in some embodiments, the GOA signal line 130 includes a first clock signal line 131, a second clock signal line 132, a high voltage power line 133, and a low voltage power line 134. The first part 111 of the light shielding layer 110 includes a plurality of first blocks 1110. In one example, a respective one of the plurality of first blocks 1110 of the light shielding layer 110 may be connected electrically in parallel with the first clock signal line 131. In another example, a respective one of the plurality of first blocks 1110 of the light shielding layer 110 may be connected electrically in parallel with the second clock signal line 132. In another example, a respective one of the plurality of first blocks 1110 of the light shielding layer 110 may be connected electrically in parallel with the high voltage power line 133. In another example, a respective one of the plurality of first blocks 1110 of the light shielding layer 110 may be connected electrically in parallel with the low voltage power line 134.

For example, the first clock signal line 131 is connected electrically in parallel with a respect one of the plurality of first blocks 1110 of the light shielding layer 110 through at least two vias of the plurality of first vias 141. The second clock signal line 132 is electrically connected in parallel with a respect one of the plurality of first blocks 1110 of the light shielding layer 110 through at least two vias of the plurality of first vias 141. The high voltage power line 133 is electrically connected in parallel with a respect one of the plurality of first blocks 1110 of the light shielding layer 110 through at least two vias of the plurality of first vias 141. The low voltage power line 134 is electrically connected in parallel with a respect one of the plurality of first blocks 1110 of the light shielding layer 110 through at least two vias of the plurality of first vias 141.

By electrically connecting the first clock signal line 131 in parallel with the first part 111 of the light shielding layer 110, the resistance of a combination of the first clock signal line 131 and the first part 111 of the light shielding layer 110 is less than a sum of a resistance of the first clock signal line 131 and the first part 111 of the light shielding layer 110.

By electrically connecting the second clock signal line 132 in parallel with the first part 111 of the light shielding layer 110, the resistance of a combination of the second clock signal line 132 and the first part 111 of the light shielding layer 110 is less than a sum of a resistance of the second clock signal line 132 and the first part 111 of the light shielding layer 110.

By electrically connecting the high voltage power line 133 in parallel with the first part 111 of the light shielding layer 110, the resistance of a combination of the high voltage power line 133 and the first part 111 of the light shielding layer 110 is less than a sum of a resistance of the high voltage power line 133 and the first part 111 of the light shielding layer 110.

By electrically connecting the low voltage power line 134 in parallel with the first part 111 of the light shielding layer 110, the resistance of a combination of the low voltage power line 134 and the first part 111 of the light shielding layer 110 is less than a sum of a resistance of the low voltage power line 134 and the first part 111 of the light shielding layer 110.

Figure 4:
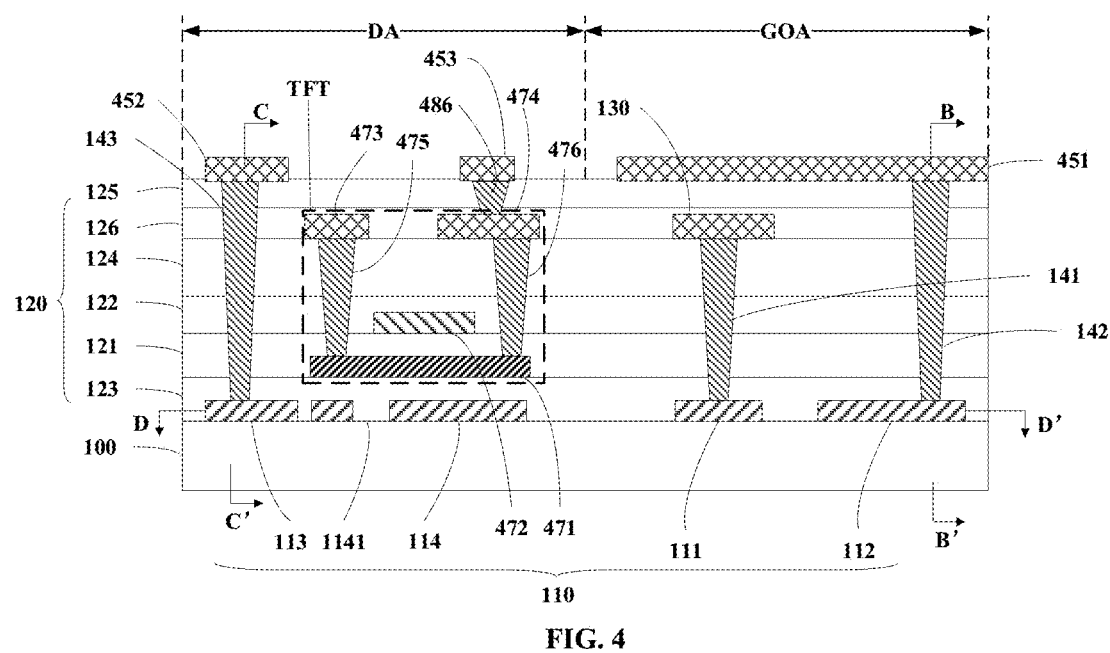
FIG. 4 is a cross-sectional view of a display substrate in some embodiments according to the present disclosure.

FIG. 4 is a cross-sectional view of a display substrate in some embodiments according to the present disclosure. Referring to FIG. 4, in some embodiments, the display substrate includes a base substrate 100, a light shielding layer 110, an insulating layer 120, and a GOA signal line 130. Optionally, the GOA signal line 130 is connected electrically in parallel with a first part 111 of the light shielding layer 110 through at least two vias of the plurality of first vias 141.

In some embodiments, the light shielding layer 110 further includes a second part 112.

In some embodiments, the insulating layer 120 includes a planarization layer 125 on a side of the GOA signal line 130 away from the base substrate 100. In one example, the planarization layer 125 is in direct contact with the GOA signal line 130. In another example, the insulating layer 120 may further include a passivation layer 126 between the GOA signal line 130 and the planarization layer 125.

Various appropriate materials may be used for making the planarization layer 125. Examples of materials suitable for forming the planarization layer 125 include, but are not limited to, silicon oxide, silicon nitride, and silicon oxynitride.

Various appropriate materials may be used for forming the passivation layer 126. Examples of materials suitable for forming the passivation layer 126 include, but are not limited to, silicon oxide, silicon nitride, and silicon oxynitride In some embodiments, the signal line includes a first signal line 451 on a side of the planarization layer 125 away from the GOA signal line 130. Optionally, the first signal line 451 is in direct contact with the planarization layer 125.

In some embodiments, the first signal line 451 is in the GOA area. Optionally, the first signal line 451 is connected electrically in parallel with the second part 112 of the light shielding layer 110 in the GOA area. Optionally, the second part 112 is spaced apart from the first part 111. Optionally, the first signal line 451 is a power supply signal line (e.g., a power supply signal line configured to supply a low level voltage signal Vss).

In some embodiments, the display substrate includes a plurality of second vias 142 extending through the insulating layer 120 in the GOA area. Optionally, the first signal line 451 is electrically connected to the second part 112 of the light shielding layer 110 through the plurality of second vias 142 respectively to connect the first signal line 451 and the second part 112 of the light shielding layer 110 electrically in parallel.

In one example, a relatively larger resistance of the first signal line 451 may lead to a relatively larger IR-Drop, and a larger IR-Drop may cause the problem of uneven display. By electrically connecting the first signal line 451 in parallel with the second part 112 of the light shielding layer 110, the resistance of a combination of the first signal line 451 and the second part of the light shielding layer 110 is less than a sum of a resistance of the first signal line 451 and s resistance of the second part 112 of the light shielding layer 110. A lower resistance of the combination of the first signal line 451 and the second part of the light shielding layer 110 decreases the IR-Drop and improves the display uniformity.

In some embodiments, the light shielding layer 110 further includes a third part 113 of the light shielding layer 110. Optionally, the third part 113 is spaced apart from both the first part 111 and the second part 112.

In some embodiments, the signal line includes a second signal line 452 on a side of the planarization layer 125 away from the GOA signal line 130. Optionally, the second signal line 452 is in the display area DA. Optionally, the second signal line 452 is connected electrically in parallel with the third part 113 of the light shielding layer in the display area DA. Optionally, the second signal line 452 is in direct contact with the planarization layer 125. Optionally, the second signal line 452 is a ground voltage line.

In some embodiments, the display substrate includes a plurality of third vias 143 extending through the insulating layer 120 and the planarization layer 125 in the display area DA. Optionally, the second signal line 452 is electrically connected to the third part 113 of the light shielding layer 110 through the plurality of third vias 143 respectively, to connect the second signal line 452 and the third part 113 of the light shielding layer 110 electrically in parallel.

By electrically connecting the second signal line 452 in parallel with the third part 113 of the light shielding layer 110, a resistance of a combination of the second signal line 452 and the light shielding layer 110 is less than a sum of a resistance of the second signal line 452 and a resistance of the third part 113 of the light shielding layer 110.

In some embodiments, the insulating layer 120 further include a buffer layer 123 on a side of the light shielding layer 110 away from the base substrate 100.

Various appropriate materials may be used for making the insulating layer 120.

Examples of materials suitable for making the insulating layer 120 include, but are not limited to, silicon oxide, and silicon nitride.

In some embodiments, the insulating layer 120 further includes a first insulating layer 121 on a side of the buffer layer 123 away from the base substrate 100. Optionally, the first insulating layer 121 is in direct contact with the buffer layer 123.

Various appropriate materials may be used for making the first insulating layer 121. Examples of materials suitable for making the first insulating layer 121 include, but are not limited to, silicon oxide, and silicon nitride.

In some embodiments, the insulating layer 120 further includes a second insulating layer 122 on a side of the first insulating layer 121 away from the base substrate 100. Optionally, the second insulating layer 122 is in direct contact with the first insulating layer 121.

Various appropriate materials may be used for making the second insulating layer 122. Examples of materials suitable for making the second insulating layer 122 include, but are not limited to, silicon oxide, and silicon nitride.

In some embodiments, the insulating layer 120 further include an inter-layer dielectric layer 124 on a side of the second insulating layer 122 away from the base substrate 100. Optionally, the inter-layer dielectric layer 124 is in direct contact with the second insulating layer 122.

Various appropriate materials may be used for making the inter-layer dielectric layer 124. Examples of materials suitable for making the inter-layer dielectric layer 124 include, but are not limited to, silicon oxide, and silicon nitride.

In some embodiments, the GOA signal line 130 is on a side of the inter-layer dielectric layer 124 away from the base substrate 100. Optionally, the GOA signal line 130 is in direct contact with the inter-layer dielectric layer 124.

In some embodiments, the plurality of first vias 141 extend through the buffer layer 123, the first insulating layer 121, the second insulating layer 122, and the inter-layer dielectric layer 124.

In some embodiments, the insulating layer 120 includes a planarization layer 125 on a side of the inter-layer dielectric layer 124 away from the base substrate 100.

In some embodiments, the display substrate includes an active layer 471 between the buffer layer 123 and the first insulating layer 121. Optionally, the active layer 471 includes a semiconductor layer, e.g. a polysilicon layer.

In some embodiments, the display substrate includes a gate electrode 472 between the first insulating layer 121 and the second insulating layer 122.

In some embodiments, the display substrate includes a source electrode 473, and a drain electrode 474, on a side of the inter-layer dielectric layer 124 away from the base substrate 100. Optionally, the source electrode 473 is in direct contact with the inter-layer dielectric layer 124, and the drain electrode 474 is in direct contact with the inter-layer dielectric layer 124. Optionally, the source electrode 473, the drain electrode 474, and the GOA signal line 130 are formed in a same layer. Optionally, the source electrode 473 is spaced apart from the GOA signal line 130, and the drain electrode 474 is spaced apart from the GOA signal line 130.

In some embodiments, the display substrate includes a plurality of fourth vias 475 extending through the first insulating layer 121, the second insulating layer 122, and the inter-layer dielectric layer 124. In some embodiments, the display substrate includes a plurality of fifth vias 476 extending through the first insulating layer 121, the second insulating layer 122, and the inter-layer dielectric layer 124.

Optionally, a conductive material is filled in the plurality of fourth vias 475. Optionally, a conductive materials is filled in the plurality of fifth vias 476. For example, the conductive material is a metallic material.

Optionally, the source electrode 473 is electrically connected to the active layer 471 through one of the plurality of fourth vias 475. Optionally, the drain electrode 474 is electrically connected to the active layer 471 through one of the plurality of fifth vias 476.

In some embodiments, the display substrate includes a plurality of thin film transistors TFT in display area DA. A respective one of the plurality of thin film transistors TFT includes, but is not limited to, the active layer 471, the gate electrode 472, the source electrode 473, the drain electrode 474, one of the plurality of fourth vias 475, and one of the plurality of fifth vias 476.

Optionally, the respective one of the plurality of thin film transistors TFT further includes a portion of the first insulating layer 121. For example, the portion of the first insulating layer 121 is between the active layer 471 and the gate electrode 472. An orthographic projection of the portion of the first insulating layer 121 on the base substrate 100 covers an orthographic projection of the respective one of the plurality of thin film transistors TFT on the base substrate 100.

Optionally, the respective one of the plurality of thin film transistors TFT further includes a portion of the second insulating layer 122. For example, the portion of the second insulating layer 122 is between the gate electrode 472, and the source and drain electrodes. An orthographic projection of the portion of the second insulating layer 122 on the base substrate 100 covers the orthographic projection of the respective one of the plurality of thin film transistors TFT on the base substrate 100.

Optionally, the respective one of the plurality of thin film transistors TFT further includes a portion of the inter-level dielectric (ILD) layer. For example, the portion of the inter-layer dielectric layer 124 is between the gate electrode 472, and the source and drain electrodes. An orthographic projection of the portion of the inter-layer dielectric layer 124 on the base substrate 100 covers the orthographic projection of the respective one of the plurality of thin film transistors TFT on the base substrate 100.

In some embodiments, the signal line is a third signal line 453 on a side of the planarization layer 125. Optionally, the third signal line 453 is a power source voltage line. The third signal line 453 is electrically connected to the drain electrode 474 through one of a plurality of sixth vias 486.

In some embodiments, the light shielding layer 110 includes the first part 111, the second part 112, the third part 113 and the plurality of light shielding blocks 114. Optionally, the first part 111 of the light shielding layer 110 and the plurality of light shielding blocks 114 are in a same layer and includes a same material. Optionally, the first part 111 and the second part 112 of the light shielding layer 110, and the plurality of light shielding blocks 114 are in a same layer and includes a same material. Optionally, the first part, the second part, and the third part of the light shielding layer, and the plurality of light shielding blocks are in a same layer and include a same material.

Optionally, the plurality of light shielding blocks 114 is on the base substrate 100. Optionally, the plurality of light shielding blocks 114 is in the display area DA. Optionally, a respective one of the plurality of light shielding blocks 114 is on a side of the active layer 471 of the plurality of thin film transistors TFT closer to the base substrate 100 for shielding light from irradiating on the active layer 471. For example, a respective one of the plurality of light shielding blocks 114 is corresponding to an active layer 471 of one of the plurality of thin film transistors TFT.

Optionally, an orthographic projection of the respective one of the plurality of light shielding blocks 114 on the base substrate 100 covers an orthographic projection of the active layer 471 of the plurality of thin film transistors TFT on the base substrate 100.

Optionally, an opening 1141 is in the respective one of the plurality of light shielding blocks 114 allowing light passing through to a photosensor for fingerprint detection.

Optionally, a constant voltage (e.g. ground voltage) is applied to the plurality of light shielding blocks 114 of the light shielding layer 110, which may reduce the floating body effect of the plurality of thin film transistors TFT corresponding to the plurality of light shielding blocks 114.

Figure 5:
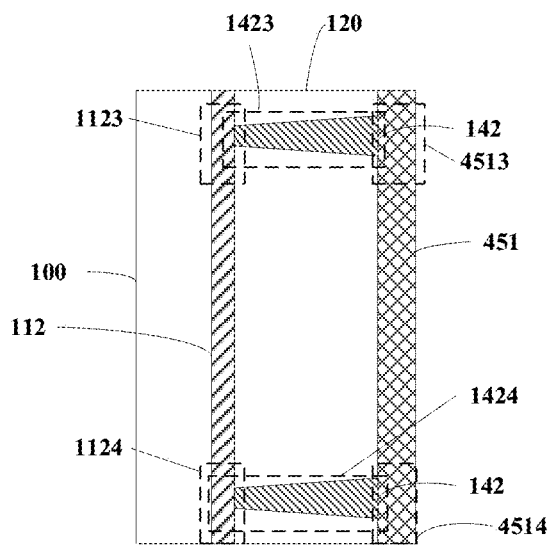
FIG. 5 is a cross-sectional view of the display substrate along line B-B' in FIG. 4.

FIG. 5 is a cross-sectional view of the display substrate along line B-B' in FIG. 4. The FIG. 5 shows two vias of the plurality of second vias 142. Optionally, the two vias of the plurality of second vias 142 is filed with a conductive material (e.g. metallic material). Referring to both FIG. 4 and FIG. 5, optionally, the insulating layer 120 includes the buffer layer 123, the first insulating layer 121, the second insulating layer 122, the inter-layer dielectric layer 124, and a planarization layer 125.

In some embodiments, the second part 112 of the light shielding layer 110 is electrically connected in parallel with the first signal line 451 through at least two vias of the plurality of second vias 142. Optionally, one portion of the first signal line 451 is electrically connected to one portion of the second part 112 of the light shielding layer 110, another portion of the first signal line 451 is electrically connected to another portion of the second part 112 of the light shielding layer 110.

For example, a fifth portion 4513 of the first signal line 451 is electrically connected to a sixth portion 1123 of the second part 112 of the light shielding layer 110 through a third via 1423 of the plurality of second vias 142 to connect the first signal line 451 and the second part 112 of the light shielding layer 110 electrically in parallel. A seventh portion 4514 of the first signal line 451 is electrically connected to a eighth portion 1124 of the second part 112 of the light shielding layer 110 through a fourth via 1424 of the plurality of second vias 142 to connect the first signal line 451 and the second part 112 of the light shielding layer 110 electrically in parallel.

Optionally, the amount of the plurality of second vias 142 is more than two.

Optionally, three or more vias of the plurality of second vias 142 may be provided for the first signal line 451 electrically connected in parallel with the second part 112 of the light shielding layer 110.

Figure 6:
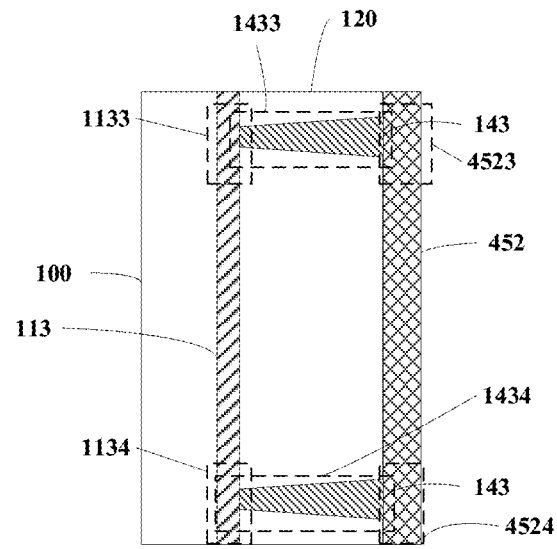
FIG. 6 is a cross-sectional view of the display substrate along line C-C' in FIG. 4.

FIG. 6 is a cross-sectional view of the display substrate along line C-C' in FIG. 4. FIG. 6 shows two vias of the plurality of third vias 143. Optionally, the two vias of the plurality of third vias 143 is filed with a conductive material (e.g., metallic material). Referring to both FIG. 4 and FIG. 6, optionally, the insulating layer 120 includes the buffer layer 123, the first insulating layer 121, the second insulating layer 122, the inter-layer dielectric layer 124, and a planarization layer 125.

In some embodiments, the third part 113 of the light shielding layer 110 is electrically connected in parallel with the second signal line 452 through at least two vias of the plurality of third vias 143. Optionally, one portion of the second signal line 452 is electrically connected to one portion of the third part 113 of the light shielding layer 110, another portion of the second signal line 452 is electrically connected to another portion of the third part 113 of the light shielding layer 110.

For example, a ninth portion 4523 of the second signal line 452 is electrically connected to a tenth portion 1133 of the third part 113 of the light shielding layer 110 through a fifth via 1433 of the plurality of third vias 143 to connect the second signal line 452 and the third part 113 of the light shielding layer 110 electrically in parallel. An eleventh portion 4524 of the second signal line 452 is electrically connected to a twelfth portion 1134 of the third part 113 of the light shielding layer 110 through a sixth via 1434 of the plurality of third vias 143 to connect the second signal line 452 and the third part 113 of the light shielding layer 110 electrically in parallel.

Optionally, the amount of the plurality of third vias 143 is more than two. Optionally, three or more vias of the plurality of third vias 143 may be provided for the second signal line 452 electrically connected in parallel with the third part 113 of the light shielding layer 110.

Figure 7:
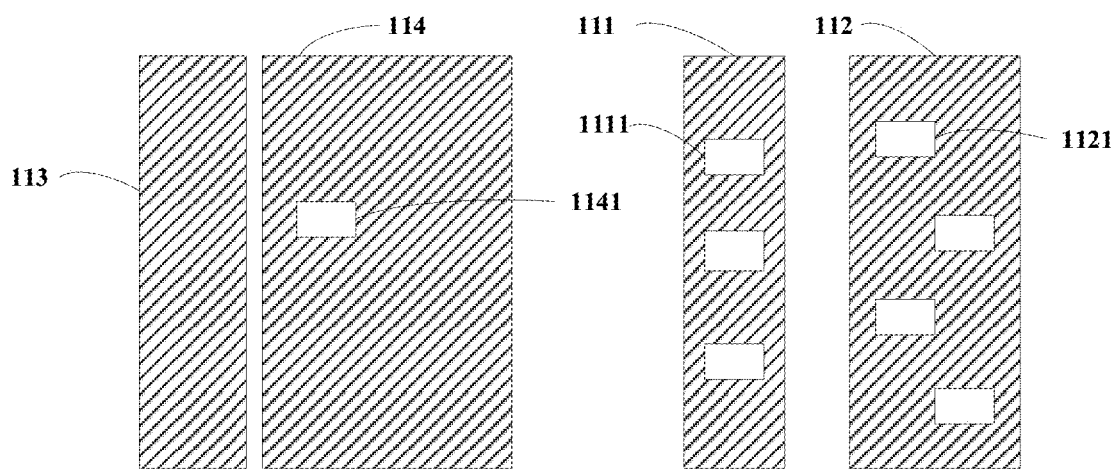
FIG. 7 is a cross-sectional view of the display substrate along line D-D' in FIG. 4.

FIG. 7 is a cross-sectional view of the display substrate along line D-D' in FIG. 4. The FIG. 7 shows the first part 111 of the light shielding layer 110, the second part 112 of the light shielding layer 110, the third part 113 of the light shielding layer 110, and the plurality of light shielding blocks 114 of the light shielding layer 110. Optionally, an opening 1141 is in the respective one of the plurality of light shielding blocks 114 allowing light passing through to a photosensor for fingerprint detection.

In some embodiments, at least one opening 1111 is in the first part 111 of the light shielding layer 110. Having at least one opening 1111 in the first part 111 may reduce the area of the light shielding layer 110 facing the GOA signal line, and may reduce the adversary effect the light shielding layer 110 have on the GOA signal line. For example, having at least one opening 1111 in the first part 111 may reduce the overlapping area between an orthographic projection of the light shielding layer on the base substrate and an orthographic projection of the GOA signal line on the base substrate. Optionally, the ratio of the opening area of at least one opening 1111 to the area of the first part 111 is in a range of 0.5% to 60%, e.g. 0.5% to 10%, 10% to 20%, 20% to 30%, 30% to 40%, 40% to 50%, and 50% to 60%.

In some embodiments, at least one opening 1121 is in the second part 112 of the light shield layer 110. Having at least one opening 1121 in the second part 112 may also reduce the adversary effect the light shielding layer have on the GOA signal line. Optionally, the ratio of the opening area of at least one opening 1121 to the area of the second part 112 is in a range of 0.5% to 60%, e.g. 0.5% to 10%, 10% to 20%, 20% to 30%, 30% to 40%, 40% to 50%, and 50% to 60%.

Figure 8:
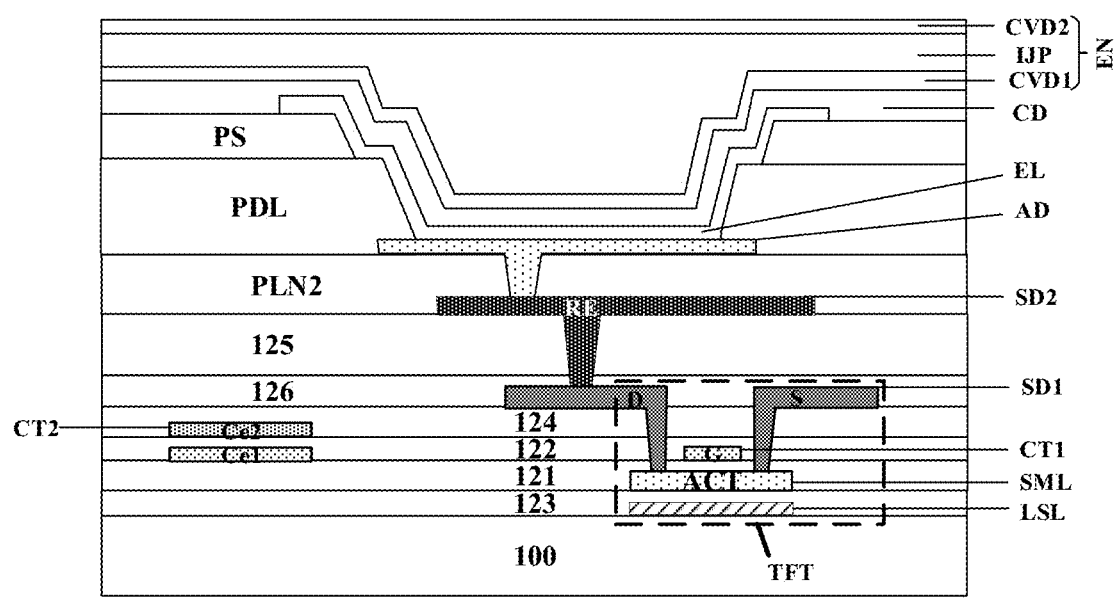
FIG. 8 illustrates a detailed structure in a display region in a display substrate in some embodiments according to the present disclosure.

Various implementations of the present display substrate may be practiced. FIG. 8 illustrates a detailed structure in a display region in a display substrate in some embodiments according to the present disclosure. Referring to FIG. 8, the display substrate in some embodiments includes a base substrate 100, a light shielding layer LSL on the base substrate 100; a buffer layer 123 on a side of the light shielding layer LSL away from the base substrate 100, an active layer ACT (a part of a semiconductor material layer SML) of a respective one of a plurality of thin film transistors TFT on a side of the buffer layer 123 away from the base substrate 100; a first insulating layer 121 on a side of the active layer ACT away from the base substrate 100; a gate electrode G and a first capacitor electrode Ce1 (both are parts of a first conductive layer CT1) on a side of the first insulating layer 121 away from the base substrate 100; a second insulating layer 122 on a side of the gate electrode G and the first capacitor electrode Ce1 away from the base substrate 100; a second capacitor electrode Ce2 (a part of a second conductive layer CT2) on a side of the second insulating layer 122 away from the base substrate 100; an inter-layer dielectric layer 124 on a side of the second capacitor electrode Ce2 away from the base substrate 100; a first electrode S and a second electrode D (parts of a first signal line layer SD1) on a side of the inter-layer dielectric layer 124 away from the base substrate 100; a passivation layer 126 on a side of the first electrode S and the second electrode D away from the base substrate 100; a planarization layer 125 on a side of the passivation layer 126 away from the base substrate 100; a relay electrode RE (a part of a second signal line layer SD2) on a side of the planarization layer 125 away from the base substrate 100; a second planarization layer PLN2 on a side of the relay electrode RE away from the base substrate 100; an anode AD on a side of the second planarization layer PLN2 away from the base substrate 100; a pixel definition layer PDL defining a sub-pixel aperture and on a side of the second planarization layer PLN2 away from the base substrate 100; a light emitting layer EL at least partially in the subpixel aperture and on a side of the anode AD away from the second planarization layer PLN2; a cathode CD on a side of the light emitting layer EL away from the anode AD; a spacer layer PS on a side of the pixel definition layer PDL away from the second planarization layer PLN2; and an encapsulating layer EN on a side of the cathode CD away from the base substrate 100, encapsulating the light emitting element. The encapsulating layer EN in some embodiments includes a first inorganic encapsulating sub-layer CVD1 on a side of the cathode layer CD away from the base substrate 100, an organic encapsulating sub-layer IJP on a side of the first inorganic encapsulating sub-layer CVD1 away from the base substrate 100, and a second inorganic encapsulating sub-layer CVD2 on a side of the organic encapsulating sub-layer IJP away from the first inorganic encapsulating sub-layer CVD1.

Referring to FIG. 4 and FIG. 8, the first signal line 451, the second signal line 452, and the third signal line 453 in some embodiments are in the second signal line layer SD2. The source electrode 473, the drain electrode 474, and the GOA signal line 130 in some embodiments are in the first signal line layer SD1. The first part 111, the second part 112, the third part 113, and the fourth part 114 in some embodiments are in the light shielding layer LSL. The active layer 471 in some embodiments is in the semiconductor material layer SML. The gate electrode 472 in some embodiments is in the first conductive layer CT1.

In some embodiments, the first signal line 451 is in a same layer as the relay electrode RE. As used herein, the term "same layer" refers to the relationship between the layers simultaneously formed in the same step. In one example, the first signal line 451 and the relay electrode RE are in a same layer when they are formed as a result of one or more steps of a same patterning process performed in a material deposited in a same deposition process. In another example, the first signal line 451 and the relay electrode RE can be formed in a same layer by simultaneously performing the step of forming the first signal line 451 and the step of forming the relay electrode RE. The term "same layer" does not always mean that the thickness of the layer or the height of the layer in a cross-sectional view is the same.

Referring to FIG. 3 and FIG. 8, the first clock signal line 131, the second clock signal line 132, the high voltage power line 133, and the low voltage power line 134 in some embodiments are in the first signal line layer SD1. The plurality of first blocks 1110 in some embodiments are in the light shielding layer LSL.

Figure 9:
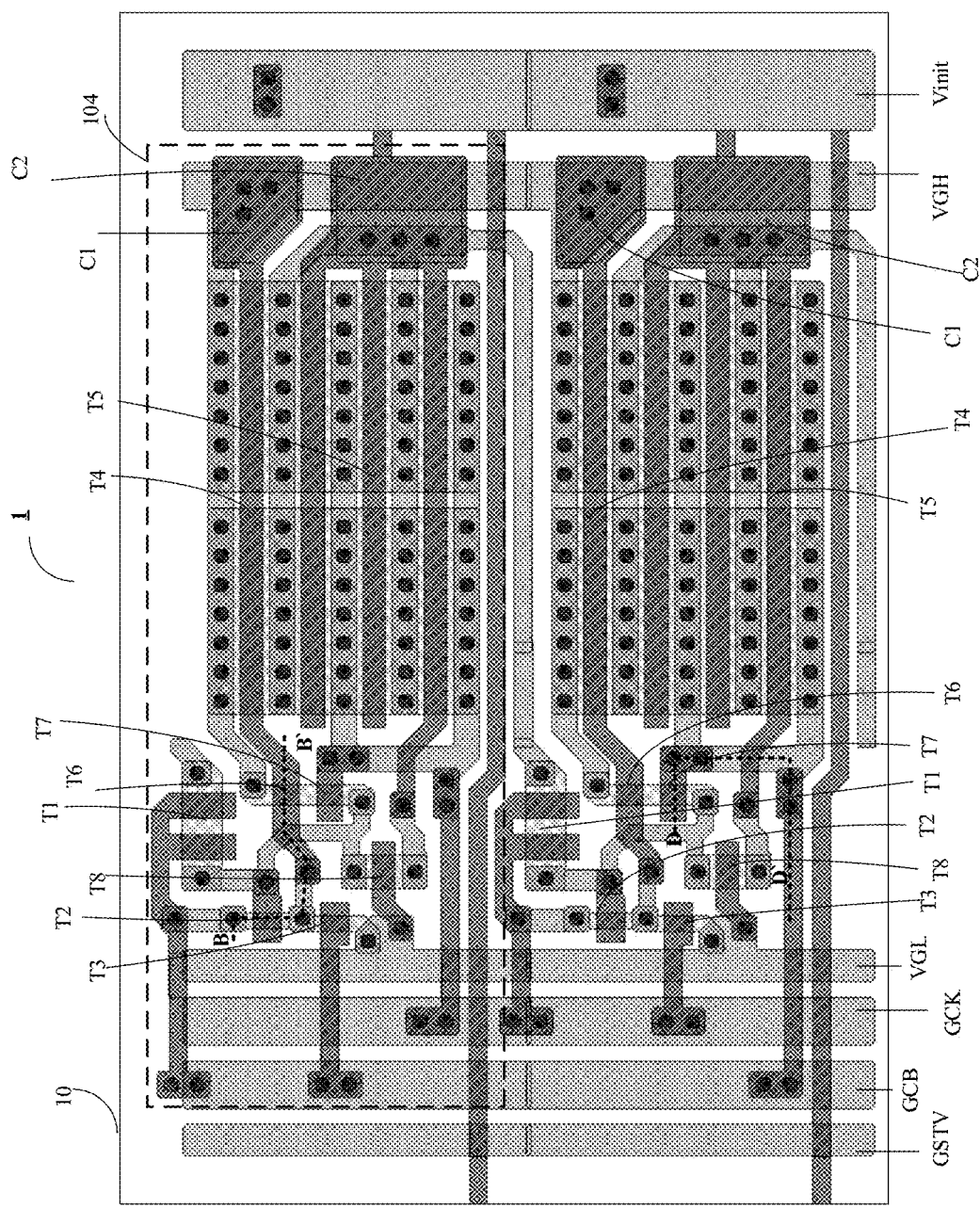
FIG. 9 a schematic diagram illustrating the structure of a display substrate in some embodiments according to the present disclosure.

FIG. 9 a schematic diagram illustrating the structure of a display substrate in some embodiments according to the present disclosure. Referring to FIG. 9, the display substrate in some embodiments includes a base substrate 10 and a shift register unit 104 provided on the base substrate 10, a first power line VGH, a second power line VGL, and a plurality of clock signal lines (e.g., a first sub-clock signal line GCK, a second sub-clock signal line GCB, and a trigger signal line GSTV shown in FIG. 9). For example, the first power line VGH, the second power line VGL, and the plurality of clock signal lines extend on the base substrate 10 along a first direction (e.g., the vertical direction shown in FIG. 9) and are configured to provide a first voltage, a second voltage, and a plurality of clock signals (e.g., a trigger signal, a first clock signal or a second clock signal) to the shift register cell 104, respectively.

In one example, the first power line VGH, the second power line VGL, and the plurality of clock signal lines are parallel to the first direction.

In another example, any two of the first power line VGH, the second power line VGL, and the plurality of clock signal lines may cross over each other at a certain angle (e.g., less than or equal to 20°).

In some embodiments, the first power line VGH is configured to provide a first voltage to the plurality of cascaded shift register cells 104 included in the scan drive circuit, and the second power line VGL is configured to provide a second voltage to the plurality of cascaded shift register cells 104 included in the scan drive circuit. Optionally, the first voltage is greater than the second voltage, e.g., the first voltage is a high level direct current voltage and the second voltage is a low level direct current voltage.

The base substrate 10 may be made of various appropriate materials such as glass, plastic, quartz or other suitable material.

In some embodiments, the display substrate 1 includes a pixel array area and a peripheral area outside the pixel array area. The first power line VGH, the second power line VGL, the plurality of clock signal lines, and the shift register unit 104 are located within the peripheral area and on one side of the base substrate 10, for example, on the left side of the base substrate 10, or on the right side of the base substrate 10, or on both left and right sides of the base substrate 10.

In some embodiments, the second power line VGL and the plurality of clock signal lines are located on the side of the shift register unit 104 away from the pixel array area, e.g., both are located on the left side of the shift register unit 104 as shown in FIG. 9. An orthographic projection of the shift register unit 104 on the base substrate 10 is located between an orthographic projection of the second power line VGL and the plurality of clock signal lines on the base substrate 10 and an orthographic projection of the pixel array area on the base substrate 10.

In some embodiments, the first power line VGH is located on the side of the shift register unit 104 closer to the pixel array area. An orthographic projection of the first power line VGH on the base substrate 10 is located between an orthographic projection of the shift register unit 104 on the base substrate 10 and an orthographic projection of the pixel array area on the base substrate 10.

In some embodiments, the pixel array area includes a plurality of subpixels arranged in an array. e.g. each of the plurality of subpixels includes a pixel driving circuit, and may further include, for example, a light emitting element.

In some embodiments, a plurality of cascaded shift register cells 104 are parts of a gate drive circuit. For example, the output terminal GOUT of the plurality of shift register units 104 is connected to the gate scan signal terminal of each pixel driving circuit located in the pixel array area to provide an output signal (e.g., a gate scanning signal) to each pixel driving circuit, thereby driving light emission in the light emitting element. Various appropriate pixel driving circuits may be used, examples of which include 7T1C, 2T1C, 4T2C, 8T2C, and so on.

In FIG. 9, only the first stage shift register unit 104 and the second stage shift register unit 104 in the gate drive circuit are shown. As shown in FIG. 9, the first clock terminal CK of the first stage shift register unit 104 is connected to the second sub-clock signal line GCB to receive the first clock signal. The second clock signal terminal CB of the first stage shift register unit 104 and the first clock signal GCK of the first stage shift register unit 104 are connected to receive the second clock signal. The first clock signal terminal CK and the first sub-clock signal line GCK of the second stage shift register unit are connected to receive the first clock signal. The second clock signal terminal CB and the second sub-clock signal line GCB of the second stage shift register unit are connected to receive the second clock signal. The first clock terminal of the X-th (X is an odd number greater than 1) stage shift register unit 104 has the first clock terminal CK and the second sub-clock signal line GCB connected to receive the first clock signal. The second clock signal terminal CB of the X-th stage shift register unit 104 is connected to the first clock signal GCK to receive the second clock signal. The first clock signal terminal CK of the (X+1)-th stage shift register unit is connected to the first sub-clock signal line GCK to receive the first clock signal. The second clock signal terminal CB of the (X+1)-th stage shift register unit is connected to the second sub-clock signal line GCB to receive the second clock signal.

The shift register unit and the clock signal line at each stage may be connected in various appropriate manner. For example, the input of the first stage shift register unit 104 may be connected to the trigger signal line GSTV to receive the trigger signal as the input signal. The input of the second stage shift register unit 104 may be connected to the output of the previous stage shift register unit (e.g., the first stage shift register unit) GOUT. The remaining stages may be connected in a similar manner.

The following is an example of the structure of the first-stage shift register unit, and the embodiments of the present disclosure are not limited in this respect. As shown in FIG. 9, since the first clock terminal CK of the first stage shift register cell 104 is connected to the second sub-clock signal line GCB to receive the first clock signal, and the second clock signal terminal CB of the first stage shift register cell 104 is connected to the first clock signal GCK to receive the second clock signal, in this example, the second sub-clock signal line GCB is the first clock signal line and the first sub-clock signal line GCK is the second clock signal line, and the embodiments of the present disclosure are not limited in this regard.

Figure 10:
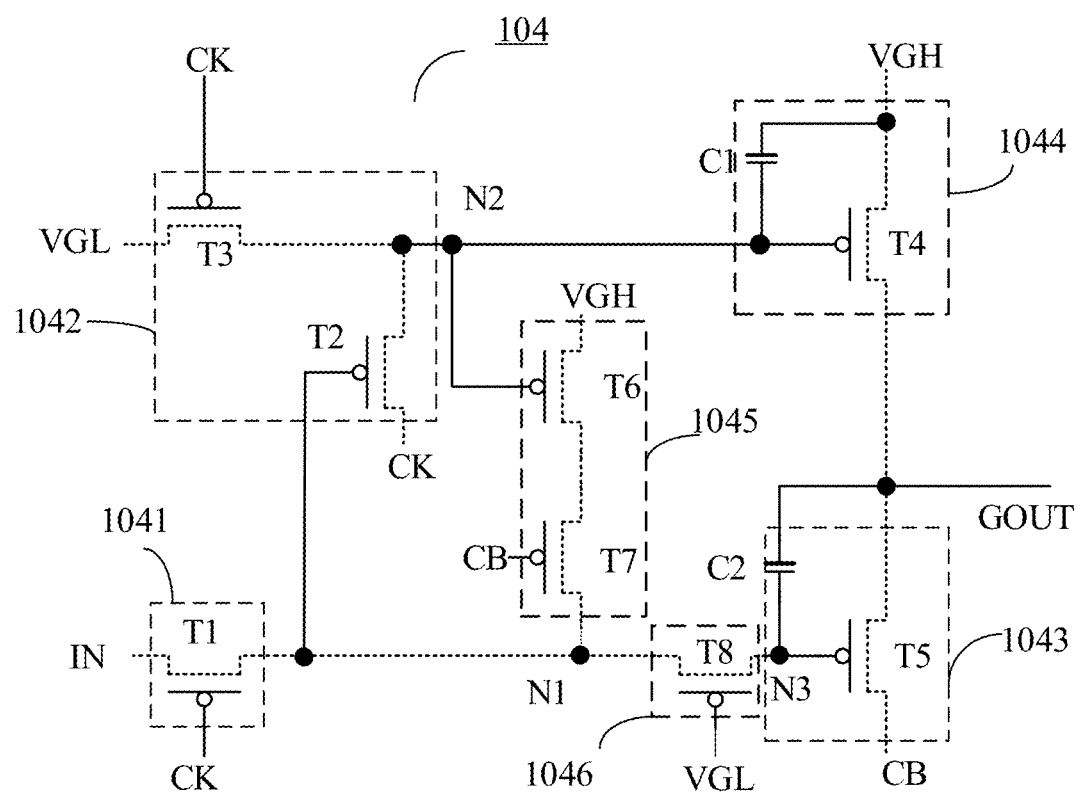
FIG. 10 is a circuit diagram of a shift register unit.

FIG. 10 is a circuit diagram of a shift register unit. Referring to FIG. 9 and FIG. 10, the shift register unit 104 comprises eight transistors (an input transistor T1, a first control transistor T2, a second control transistor T3, an output control transistor T4, an output transistor T5, a first noise reduction transistor T6, a second noise reduction transistor T7, and a voltage regulator transistor T8) and two capacitors (a first capacitor C1 and a second capacitor C2). When a plurality of shift register units 104 are cascaded, the first electrode of the input transistor T1 in the first level shift register unit 104 is connected to the input terminal IN, which is configured to be connected to the trigger signal line GSTV to receive the trigger signal as an input signal, while the first electrode of the input transistor T1 in the other levels shift register units 104 is electrically connected to the output of the previous level shift register unit. The first electrode of the input transistor T1 in the other shift register unit 104 is electrically connected to the output of the previous shift register unit 104 to receive the output signal from the output of GOUT of the previous shift register unit 104 as an input signal, thereby achieving a shift output for, for example, progressive scanning of the array of pixel cells in the active display area.

In some embodiments, the shift register unit further comprises a first clock signal terminal CK and a second clock signal terminal CB, GCK denoting a first sub-clock signal line and GCB denoting a second sub-clock signal line. In one example, when the first clock signal terminal CK and the first sub-clock signal line GCK are connected to receive a first clock signal, the first sub-clock signal line GCK is the first clock signal line. In another example, when the first clock signal terminal CK is connected to the second sub-clock signal line GCB to receive the first clock signal, the second sub-clock signal line GCB is the first clock signal line. The second clock signal terminal CB is connected to the second sub-clock signal line GCB or the first sub-clock signal line GCK to receive the second clock signal.

The following is an example of the connection of the first clock signal terminal CK to the first sub-clock signal line GCK to receive the first clock signal and the connection of the second clock signal terminal CB to the second sub-clock signal line GCB to receive the second clock signal, i.e. the first sub-clock signal line GCK as the first clock signal line and the second sub-clock signal line GCB as the second clock signal line. In one example, the first clock signal GCK and the second clock signal GCB may be pulsed signals with a duty cycle greater than 50%, and they are, for example, half a cycle apart. VGH indicates the first power supply line and the first voltage provided by the first power supply line, for example, the first voltage is a high level direct current voltage. VGL indicates the second power supply line and the second voltage provided by the second power supply line, for example, the second voltage is a low level direct current voltage, and the first voltage is greater than the second voltage. N1, N2 and N3 denote the first node, the second node and the third node in the circuit schematic, respectively.

In some embodiments, the gate terminal of the input transistor T1 is connected to the first clock signal terminal CK (the first clock signal terminal CK is connected to the first sub-clock signal line GCK) to receive the first clock signal, the second electrode of the input transistor T1 is connected to the input terminal IN, and the first electrode of the input transistor T1 is connected to the first node N1. In one example, when the shift register unit is a first stage shift register unit, input terminal IN is connected to the trigger signal line GSTV to receive the trigger signal. In another example, when the shift register unit is a shift register unit of a stage other than the first stage shift register, input terminal IN is connected to the output GOUT of its superior shift register unit.

In some embodiments, the gate electrode of the first control transistor T2 is connected to the first node N1, the second electrode of the first control transistor T2 is connected to the first clock signal terminal CK to receive the first clock signal, and the first electrode of the first control transistor T2 is connected to the second node N2.

In some embodiments, the gate electrode of the second control transistor T3 is connected to the first clock signal terminal CK to receive the first clock signal, the second electrode of the second control transistor is connected to the second power line VGL to receive the second voltage, and the first electrode of the second control transistor T3 is connected to the second node N2.

In some embodiments, the gate electrode of the output control transistor T4 is connected to the second node N2, the first electrode of the output control transistor T4 is connected to the first power line VGH to receive the first voltage, and the second electrode of the output control transistor T4 is connected to the output GOUT.

In some embodiments, the first electrode of the first capacitor is connected to the second node N2, and the second electrode of the first capacitor C1 is connected to the first power supply line VGH.

In some embodiments, the gate electrode of the output transistor T5 is connected to the third node N3, the first electrode of the output transistor T5 is connected to the second clock signal terminal CB, and the second electrode of the output transistor T5 is connected to the output terminal GOUT.

In some embodiments, the first electrode of the second capacitor C2 is connected to the third node N3, and the second electrode of the second capacitor C2 is connected to the output terminal GOUT.

In some embodiments, the gate electrode of the first noise reduction transistor T6 is connected to the second node N2, the first electrode of the first noise reduction transistor T6 is connected to the first power line VGH to receive the first voltage, and the second electrode of the first noise reduction transistor T6 is connected to the second electrode of the second noise reduction transistor T7.

In some embodiments, the gate electrode of the second noise reduction transistor T7 is connected to the second clock signal terminal CB (the second clock signal terminal CB is connected to the second sub-clock signal line GCB) to receive the second clock signal, and the first electrode of the second noise reduction transistor T7 is connected to the first node N1.

In some embodiments, the gate electrode of the voltage regulator transistor T8 is connected to the second power line VGL to receive the second voltage, the second electrode of the voltage regulator transistor T8 is connected to the first node N1, and the first electrode of the voltage regulator transistor T8 is connected to the third node N3.

The transistors in the shift register cell 104 shown in FIG. 10 are all illustrated as P-type transistors, e.g., a P-type transistor is turned when the gate electrode is connected to a low level (on level) voltage signal and is turned off when the gate electrode is connected to a high level (off level) voltage signal. In one example, the first electrode of the transistor can be the source and the second electrode of the transistor can be the drain.

In some embodiments, referring to FIG. 9 and FIG. 10, the shift register unit 104 includes an input circuit 1041, an output circuit 1043, a first control circuit 1042, and an output control circuit 1044; in other examples, the shift register unit 104 also includes a second control circuit 1045 and a voltage regulator circuit 1046.

The input circuit 1041 is configured to input an input signal to the first node N1 in response to the first clock signal. for example, the input circuit 1041 is connected to the input terminal IN, the first node N1, and the first clock signal terminal CK, and is configured to be conductive under the control of the first clock signal received by the first clock signal terminal CK to connect the input terminal IN to the first node N1, thereby inputting the input signal to the first node N1. For example, when the input circuit 1041 is implemented as an input transistor T1 as described above, the connection of the input transistor T1 can be referred to in the description above and will not be repeated here.

The output circuit 1043 is configured to output the output signal to the output terminal GOUT. For example, the output circuit 1043 is connected to the third node N3, the output terminal GOUT, and the second clock signal terminal CB, and is configured to be conductive under the control of the level of the third node N3 so that the second clock signal terminal CB is connected to the output terminal GOUT, thereby outputting a second clock signal at the output terminal GOUT, for example, outputting a low level of the second clock signal. For example, when the output circuit 1043 is implemented as output transistor T5 and second capacitor C2 as described above, the connection of output transistor T5 and second capacitor C2 can be referred to in the description above and will not be repeated here.

The first control circuit 1042 is configured to control the level of the second node N2 in response to the level of the first node N1 and the first clock signal. For example, the first control circuit is connected to the first node N1, the second node N2, and the first clock signal terminal CK, and is configured to be conductive under control of the level of the first node N1 such that the second node N2 is connected to the first clock signal terminal CK, thereby providing the first clock signal provided by the first clock signal terminal CK to the second node N2. For example, the first control circuit 1042 is implemented as described above as the first control transistor T2 and the second control transistor T3, the first control transistor T2 and the second control transistor T3 are connected in a manner that can be referred to in the description above and will not be repeated here. It should be noted that the first control circuit 1042 is not limited to be connected to the first node N1, but may also be connected to other independent voltage terminals (providing the same voltage as that of the first node N1) or to a separate circuit set up in the same way as the input circuit, which is not limited by the embodiments of the present disclosure. The other circuits of the shift register unit are connected in a similar manner and will not be described herein.

The output control circuit 1044 is configured to control the level of the output GOUT under the control of the level of the second node N2. For example, the output control circuit 1044 is connected to the second node N2, the first power line VGH, and the output GOUT, and is configured such that the output GOUT is connected to the first power line VGH under control of the level of the second node N2, so that the first voltage provided by the first power line VGH is output to the output GOUT to control the output GOUT at a high level, thereby avoiding erroneous output of the shift register unit during the non-output phase. For example, when the output control circuit 1044 is implemented as output control transistor T4 and first capacitor C1 as described above, the connection of output control transistor T4 and first capacitor C1 can be referred to the description above and will not be repeated here.

The second control circuit 1045 is connected to the first node N1 and the second node N2, and is configured to control the level of the first node N1 under the control of the level of the second node N2 and the second clock signal. The second control circuit 1045 is connected to the first node N1, the second node N2, the first power line VGH, and the second clock signal terminal CB, and is configured to be conductive under the control of the level of the second node N2 and the second clock signal received by the second clock signal terminal CB, so that the first power line VGH and the first node N1 are connected, thereby charging the potential of the first node N1 to a high level in order to avoid that the output circuit 1042 becomes conductive during a non-output phase, thereby avoiding false outputs. For example, when the second control circuit 1045 is implemented as a first noise reduction transistor T6 and a second noise reduction transistor T7 as described above, the connection of the first noise reduction transistor T6 and the second noise reduction transistor T7 can be referred to in the description above and will not be repeated here.

The voltage regulator circuit 1046 is connected to the first node N1 and the third node N3, and is configured to stabilize the level of the third node N3. For example, the voltage regulator circuit 1046 is connected to the first node N1, the third node N3, and the second power line VGL, and is configured to be conductive under the control of a second voltage provided by the second power line VGL, causing the first node N1 and the third node N3 to be connected. For example, the voltage regulator circuit 1046 may be implemented as a voltage regulator transistor T8, which can be described with reference to the description of the voltage regulator transistor T8 in FIG. 10 above and will not be repeated here.

For example, the regulator transistor T8 remains on under the control of the second voltage provided by the second power supply line VGL, so that the third node N3 is connected to the first node N1 through this regulator transistor T8, thus preventing the level of the third node N3 from leaking through the input transistor T1, the first control transistor T2, and the second noise reduction transistor T7, that are connected to the first node N1, and also reducing the stress applied on the first control transistor T1 by the level of the third node N3, which may help to maintain the level of the third node N3, allowing the output transistor T5 to be fully opened during the output phase.

Figure 11:
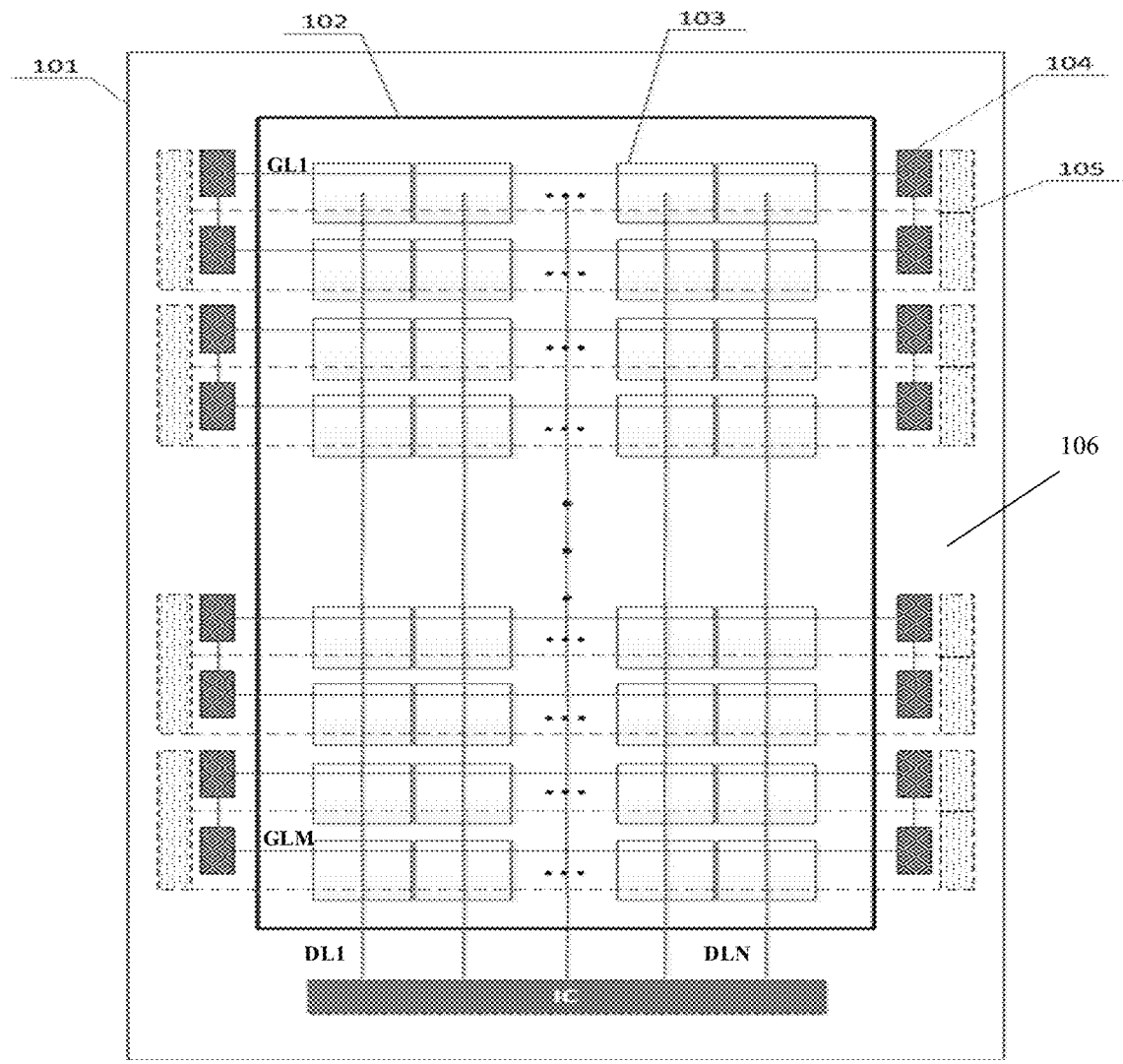
FIG. 11 is a schematic diagram illustrating the structure of a display substrate in some embodiments according to the present disclosure.

FIG. 11 is a schematic diagram illustrating the structure of a display substrate in some embodiments according to the present disclosure. Referring to FIG. 11, 101 represents the overall frame contour of the display substrate; the display substrate includes a display area (i.e. a pixel array area) 102 and a peripheral area 106 located around the display area 102, which includes an array of subpixels 103. The peripheral area 106 includes a scan-driven shift register unit 104. A plurality of cascaded scan-driven shift register units 104 comprising gate drive circuit (Gate GOA) for providing a gate scan signal, such as a progressive line shift, to the arrayed subpixels 103 in the display area 102 of the display panel 101. The peripheral area 106 also includes a light emission control shift register unit 105. A plurality of cascaded light emission control shift register units 105 form a light emission control drive circuit array (EM GOA) for providing a light emission control drive signal to the subpixels 103 in the display area 102 of the display substrate 101. The array of subpixels 103 arranged in the display area 102 of the display substrate 101 is used to provide, for example, a line-by-line shifted light emission control signal, i.e., a gate drive circuit for outputting the light emission control signals.

In some embodiments, the output signal output by the output circuit of one shift register unit 104 corresponds to output to two rows of subpixels 103.

As shown in FIG. 11, the data lines DL1-DLN (N is an integer greater than 1) connected to the data driver chip IC run longitudinally through the display area 102 to provide data signals for the arrayed subpixels 103; the gate lines GL1-GLM (M is an integer greater than 1) connected to the scan drive shift register unit 104 and the light emission control shift register unit 105 run transversely through the display area 102 to provide gate scan signals and light emission control signals for the array of subpixels 103. For example, each subpixel 103 may include a pixel driving circuit with a circuit structure such as 7T1C, 8T2C or 4T1C in the field and a light-emitting element, which operates under the control of the data signal transmitted via the data line, and the gate scan signal and light-emitting control signal transmitted via the gate line to drive the light-emitting element to emit light for display and other operations. The light emitting element can be, for example, an organic light emitting diode (OLED) or a quantum dot light emitting diode (QLED).

Figure 12:
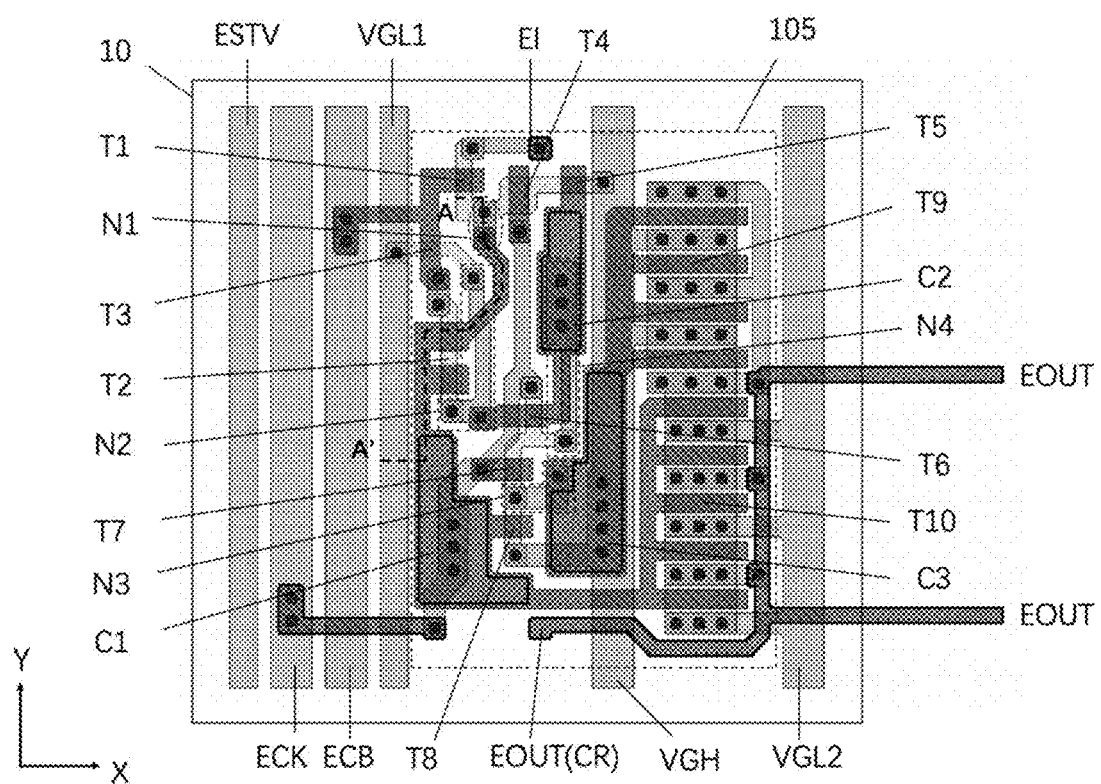
FIG. 12 a schematic diagram illustrating the structure of a display substrate in some embodiments according to the present disclosure.

FIG. 12 a schematic diagram illustrating the structure of a display substrate in some embodiments according to the present disclosure. Referring to FIG. 12, the display substrate in some embodiments includes a base substrate 10 and a shift register unit 105 provided on the base substrate 10, a first power line VGL1, a second power line VGH, a third power line VGL2, and a plurality of clock signal lines (e.g., the first clock signal line ECK, the second clock signal line ECB, and the trigger signal line ESTV. In some embodiments, the shift register unit is the light-emitting control shift register unit 105.

In one example, the first power line VGL1, the second power line VGH, the third power line VGL2, and a plurality of clock signal lines (e.g., the first clock signal line ECK, the second clock signal line ECB and the trigger signal line ESTV) extend along a first direction Y on the base substrate 10 and are configured to provide a first voltage, a second voltage, and a plurality of clock signals respectively to the shift register unit 105 (e.g., a first clock signal, a second clock signal, or a trigger signal, etc.). In another example, the first power line VGL1 and the third power line VGL2 are configured to provide a first voltage to the shift register unit 105 and the second power line VGH is configured to provide a second voltage to the shift register unit 105; the first clock signal line ECK and the second clock signal line ECB are configured to provide a first clock signal or a second clock signal, respectively, to the shift register unit 105. In another example, the first voltage is less than the second voltage, e.g., the first voltage is a low level direct current voltage and the second voltage is a high level direct current voltage. The specific connection relationships of the first power line VGL1, the second power line VGH, the third power line VGL2, and the plurality of clock signal lines to the shift register unit 105 can be referred to in the following description.

In some embodiments, the first clock signal line ECK is configured to provide the second clock signal to the shift register unit 105, and the second clock signal line ECB is configured to provide the first clock signal to the shift register unit 105. In some embodiments, the first clock signal line ECK is configured to provide the first clock signal to the shift register unit 105, and the second clock signal line ECB is configured to provide the second clock signal to the shift register unit 105.

In some embodiments, the first power line VGL1, the second power line VGH, the third power line VGL2, and the plurality of clock signal lines may extend along the first direction Y and are parallel to each other. In another example, any two of the first power line VGL1, the second power line VGH, the third power line VGL2, and the plurality of clock signal lines may cross over each other at a certain angle (e.g., less than or equal to 20°).

In some embodiments, the display substrate 1 includes a display area 102 (for example, the display area 102 may also be referred to as a pixel array area) and a peripheral area 106 located on at least one side of the pixel array area. The first power line VGL1, the second power line VGH, the third power line VGL2, the plurality of clock signal lines and the shift register unit 105 are located on the peripheral area 106 of the base substrate 10 and on one side of the base substrate 10 (between the display area 102 and the side of the base substrate 10), for example, on the left side of the base substrate 10, or of course on the right side or both the right and left sides of the base substrate 10.

In some embodiments, an orthographic projection of the first power line VGL1 on the base substrate 10 and an orthographic projection of the plurality of clock signal lines on the base substrate 10 are located on the side of an orthographic projection of the shift register unit 105 on the base substrate 10 away from the display area 102. For example, along the second direction X, both are located to the left of the shift register unit 105 shown in FIG. 12. an orthographic projection of the third power line VGL2 on the base substrate 10 is located on the side of an orthographic projection of the shift register unit 105 on the base substrate 10 closer to the display area 102. For example, along the second direction X, the orthographic projection of the third power line VGL2 is located on the right side of the shift register unit 105 shown in FIG. 12, i.e., between the orthographic projection of the shift register unit 105 on the base substrate 10 and the display area 102. That is, the orthographic projection of the shift register unit 105 on the substrate 10 is located between the orthographic projection of the first power line VGL1 on the base substrate 10 and the orthographic projection of the third power line VGL2 on the base substrate 10. The orthographic projection of the second power line VGH on the base substrate 10 partially overlaps with the orthographic projection of the shift register unit 105 on the base substrate 10 and is located between the orthographic projection of the first power line VGL1 on the base substrate 10 and the orthographic projection of the third power line VGL2 on the base substrate 10.

Referring to FIG. 12, the orthographic projection of the first power line VGL1 on the base substrate 10 is located between the orthographic projections of the first clock signal line ECK and the second clock signal line ECB on the base substrate 10 and the orthographic projection of the shift register unit 105 on the base substrate 10. For example, the first clock signal line ECK and the second clock signal line ECB are provided on the base substrate 10 in sequence along the second direction X from left to right, i.e. the orthographic projection of the first clock signal line ECK on the base substrate 10 is located on the side where the orthographic projection of the second clock signal line ECB on the base substrate 10 is away from the orthographic projection of the first power line VGL1 on the base substrate 10.

In some embodiments, the orthographic projection of the trigger signal line ESTV on the base substrate 10 may be located on the side of the orthographic projection of the first clock signal line ECK and the second clock signal line ECB on the base substrate 10 away from the orthographic projection of the shift register unit 105 on the base substrate 10, i.e., the trigger signal line ESTV, the first clock signal line ECK, and the second clock signal line ECB are located on the base substrate 10 along the second direction X from left to right.

In some embodiments, the angle between the first direction Y and the second direction X is between 70° and 90°, and includes both 70° and 90°. For example, the angle between the first direction Y and the second direction X is 70°, 75°, 85°, 90° or 80°, etc.

Figure 13A:
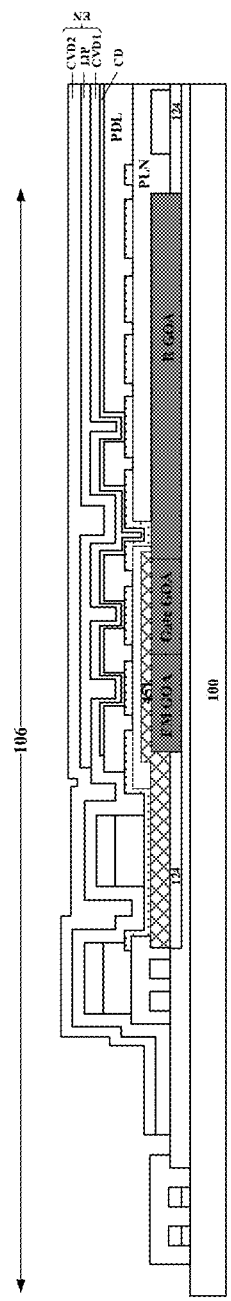
FIG. 13A is a cross-sectional view of a display substrate in some embodiments according to the present disclosure.

FIG. 13A is a cross-sectional view of a display substrate in some embodiments according to the present disclosure. Referring to FIG. 13A, in the peripheral area 106, the array substrate includes a plurality of drive circuits, including at least one of a gate drive circuit (Gate GOA), a light emission control drive circuit (EM GOA), and a reset control drive circuit (R GOA). The light emission control drive circuit EM GOA is configured to transmit light emission control signals to gate electrodes of light emission control transistors in the pixel driving circuits in the display area. The pixel driving circuits are configured to drive light emission of light emitting elements in the display area. The gate drive circuit Gate GOA is configured to transmit gate scanning signals to gate electrodes of transistors (e.g., data write transistors) in the pixel driving circuits in the display area. The reset control drive circuit R GOA is configured to transmit reset control signals to reset transistors in the pixel driving circuits in the display area.

In some embodiments, the gate drive circuit Gate GOA includes a plurality of cascaded shift register units. A respective shift register unit of the gate drive circuit Gate GOA is shown in FIG. 9 as 104.

In some embodiments, the light emission control drive circuit EM GOA includes a plurality of cascaded light emission control shift register units. A respective light emission control shift register unit of the gate drive circuit Gate GOA is shown in FIG. 11 as 105.

In some embodiments, the orthographic projection of the first signal line on the base substrate covers an orthographic projection of at least one light emission control shift register of the light emission control drive circuit EM GOA on the base substrate.

In some embodiments, the orthographic projection of the first signal line on the base substrate covers an orthographic projection of at least one shift register unit of the gate drive circuit.

In some embodiments, the orthographic projection of the first signal line on the base substrate covers an orthographic projection of at least one light emission control shift register unit of the light emission control drive circuit on the base substrate, and covers an orthographic projection of at least one shift register unit of the gate drive circuit.

As shown in FIG. 13A, in some embodiments, an orthographic projection of the first signal line 451 on the base substrate 100 at least partially covers (e.g., completely covers) an orthographic projection of at least one of the plurality of drive circuits on the base substrate 100. In one example, the orthographic projection of the first signal line 451 on the base substrate 100 at least partially covers (e.g., completely covers) an orthographic projection of the light emission control drive circuit EM GOA on the base substrate 100. In another example, the orthographic projection of the first signal line 451 on the base substrate 100 at least partially covers (e.g., completely covers) an orthographic projection of the gate drive circuit Gate GOA on the base substrate 100. In another example, the orthographic projection of the first signal line 451 on the base substrate 100 at least partially covers (e.g., completely covers) an orthographic projection of the light emission control drive circuit EM GOA on the base substrate 100, and covers an orthographic projection of the gate drive circuit Gate GOA on the base substrate 100. Optionally, the first signal line 451 is a power supply signal line (e.g., a power supply signal line configured to supply a low level voltage signal Vss).

Figure 13B:
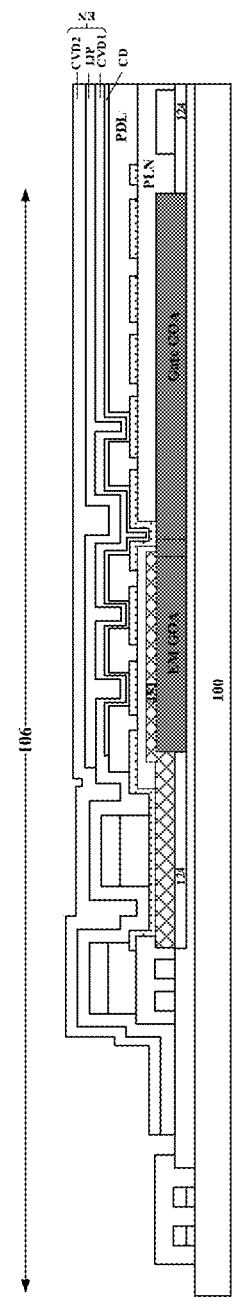
FIG. 13B is a cross-sectional view of a display substrate in some embodiments according to the present disclosure.

FIG. 13B is a cross-sectional view of a display substrate in some embodiments according to the present disclosure. Referring to FIG. 13B, in the peripheral area 106, the array substrate includes a plurality of drive circuits, including at least one of a gate drive circuit (Gate GOA) and a light emission control drive circuit (EM GOA).

As shown in FIG. 13B, in some embodiments, an orthographic projection of the first signal line 451 on the base substrate 100 at least partially covers (e.g., completely covers) an orthographic projection of at least one of the plurality of drive circuits on the base substrate 100. In one example, the orthographic projection of the first signal line 451 on the base substrate 100 at least partially covers (e.g., completely covers) an orthographic projection of the light emission control drive circuit EM GOA on the base substrate 100. Optionally, the first signal line 451 is a power supply signal line (e.g., a power supply signal line configured to supply a low level voltage signal Vss).

Figure 14:
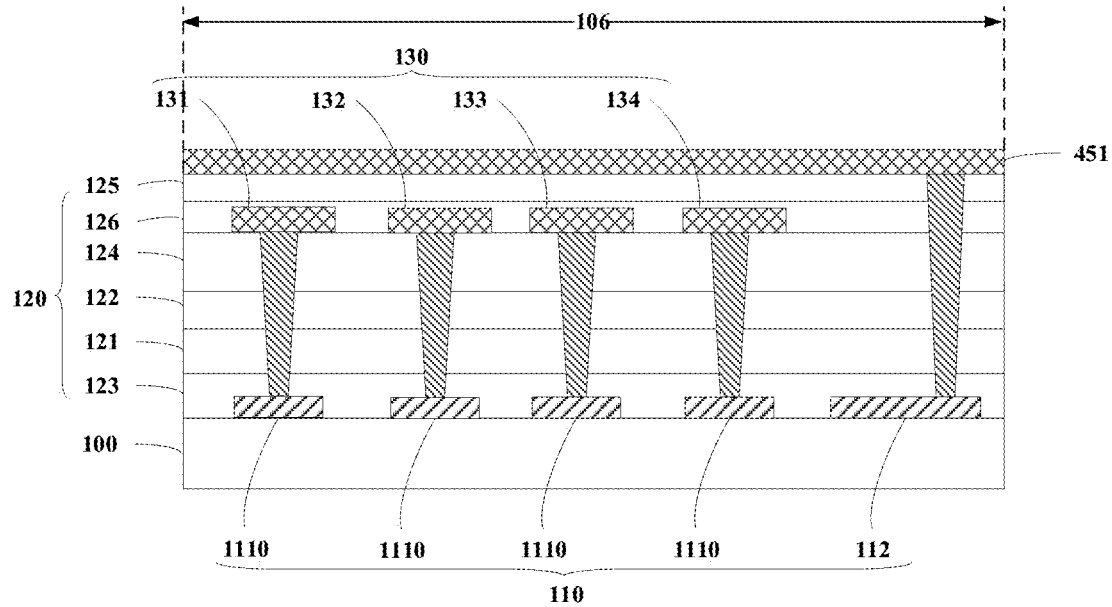
FIG. 14 is a cross-sectional view of a display substrate in some embodiments according to the present disclosure.

FIG. 14 is a cross-sectional view of a display substrate in some embodiments according to the present disclosure. Referring to FIG. 14, in some embodiments, an orthographic projection of the first signal line 451 on the base substrate 100 at least partially covers (e.g., completely covers) an orthographic projection of at least one of a first clock signal line 131, a second clock signal line 132, a high voltage power line 133, or a low voltage power line 134 on the base substrate 100. In one example, the first clock signal line 131 is a CLK signal line, the second clock signal line 132 is a CLB signal line, the high voltage power line 133 is a VGH signal line, and the low voltage power line 134 is a VGL signal line.

As shown in FIG. 14, in some embodiments, the orthographic projection of the first signal line 451 on the base substrate 100 at least partially covers (e.g., completely covers) a combination of orthographic projections of the first clock signal line 131, the second clock signal line 132, the high voltage power line 133, and the low voltage power line 134 on the base substrate 100.

In another aspect, the present disclosure also provides a display panel including the display substrate described herein, and one or more integrated circuits connected to the display substrate. Optionally, the display panel is a liquid crystal display panel. Optionally, the display panel is an organic light emitting diode display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

Figure 15A:
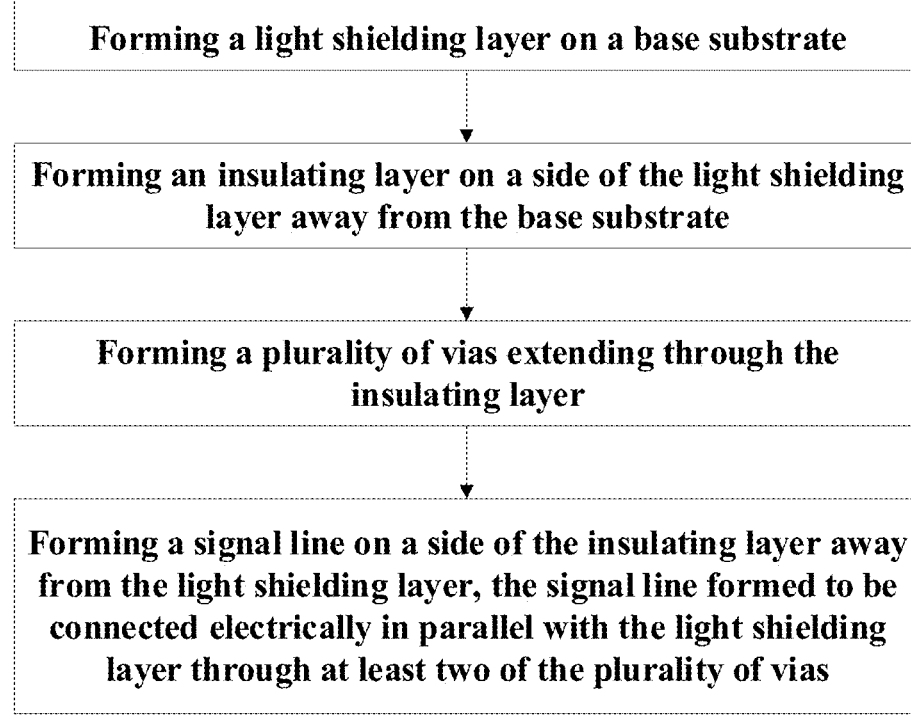
FIG. 15A is a flow chart illustrating a method of fabricating a display substrate in some embodiments according to present disclosure.

In another aspect, the present disclosure also provides a method of fabricating a display substrate having a display area and a gate-on-array (GOA) area outside the display area. FIG. 15A is a flow chart illustrating a method of fabricating a display substrate in some embodiments according to present disclosure. Referring to FIG. 15A, the method in some embodiments includes forming a light shielding layer on a base substrate; forming an insulating layer on a side of the light shielding layer away from the base substrate; forming a plurality of vias extending through the insulating layer; and forming a signal line on a side of the insulating layer away from the light shielding layer. Optionally, the signal line is formed to be connected electrically in parallel with the light shielding layer through at least two of the plurality of vias.

Optionally, the GOA signal line is electrically connected to the first part of the light shielding layer through the plurality of first vias respectively to connecting the GOA signal line and the first part of the light shielding layer electrically in parallel.

Various appropriate materials may be used for making the light shielding layer 110. Optionally, the light shielding layer 110 is made of a metal material. For example, the light shielding layer 110 is made of molybdenum. Optionally, the light shielding layer 110 is made of a light shielding material.

By forming a light shielding layer, and at least two vias of the plurality of vias extending through the insulating layer, the signal line is electrically connected in parallel with the light shielding layer through the at least two vias of the plurality of vias, and the resistance of a combination of the signal line and the light shielding layer is reduced.

In some embodiments, the light shielding layer include a first part. The plurality of vias include a plurality of first vias. The signal line is a GOA signal line. The GOA signal line is connected electrically in parallel with the first part of the light shielding layer through at least two vias of the plurality of first vias.

Figures 15B, 16A:
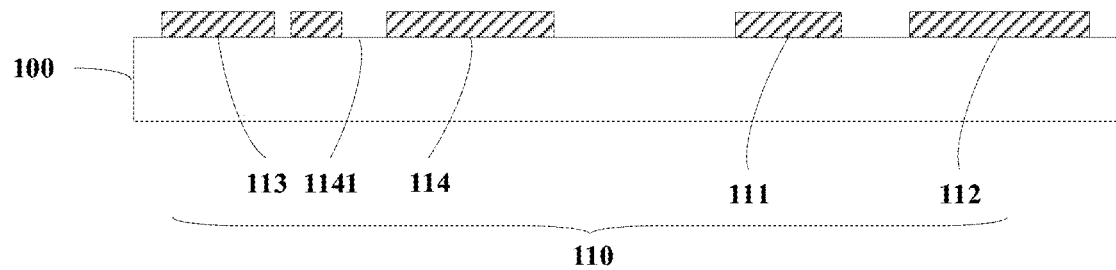
FIG. 15B is a flow chart illustrating a method of fabricating a display substrate in some embodiments according to present disclosure.
FIG. 16A to FIG. 16F are cross-sectional views of a display substrate illustrating a method of fabricating a display substrate in some embodiments according to present disclosure.

FIG. 15B is a flow chart illustrating a method of fabricating a display substrate in some embodiments according to present disclosure. Referring to FIG. 15B, in some embodiments, the method includes forming a light shielding layer on a base substrate; forming an insulating layer on a side of the light shielding layer away from the base substrate; forming a GOA signal line on a side of the insulating layer away from the light shielding layer; and forming a plurality of first vias extending through the insulating layer in the GOA area. Optionally, the GOA signal line is formed to be connected electrically in parallel with a first prat of the light shielding layer. Optionally, the first part is in the GOA area.

In some embodiments, in the process of forming a light shielding layer on a base substrate, the light shielding layer further include a second part spaced apart from the first part. In the process of forming an insulating layer on a side of the light shielding layer away from the base substrate, the insulating layer includes a planarization layer on a side of the GOA signal line. Optionally, the planarization layer is in direct contact with the GOA signal line. In the process of forming a plurality of vias extending through the insulating layer, the plurality of vias include a plurality of second vias. In the process of forming a signal line on a side of the insulating layer away from the light shielding layer, the signal line is a first signal line on a side of the planarization layer away from the base substrate.

For example, the method further includes forming a planarization layer on a side of the GOA signal line away from the base substrate; forming a first signal line in the GOA area and on a side of the planarization layer away from the base substrate; and forming a plurality of second vias extending through the insulating layer and the planarization layer in the GOA area. Optionally, the first signal line is formed to be connected electrically in parallel with a second part of the light shielding layer in the GOA area, the second part spaced apart from the first part. Optionally, the first signal line is formed to be electrically connected to the second part of the light shielding layer through the plurality of second vias respectively to connect the first signal line and the second part of the light shielding layer electrically in parallel.

In some embodiments, in the process of forming a light shielding layer on a base substrate, the light shielding layer include a third part. The third part of the light shielding layer is spaced apart from the first part of the light shielding layer. The third part of the light shielding layer is spaced apart from the second part of the light shielding layer. In the process of forming a plurality of vias extending through the insulating layer, the plurality of vias include a plurality of third vias. In the process of forming a signal line on a side of the insulating layer away from the light shielding layer, the signal line is a second signal line on a side of the planarization layer away from the base substrate.

For example, the method further includes forming a second signal line in the display area and on a side of the planarization layer away from the base substrate; and forming a plurality of third vias extending through the insulating layer and the planarization layer in the display area. Optionally, the second signal line is formed to be connected electrically in parallel with a third part of the light shielding layer in the display area. Optionally, the second signal line is formed to be electrically connected to the third part of the light shielding layer through the plurality of third vias respectively to connect the second signal line and the third part of the light shielding layer electrically in parallel.

In some embodiments, the method further includes forming a plurality of thin film transistors in the display area. Optionally, forming the light shielding layer further includes forming a plurality of light shielding blocks on the base substrate and in the display area. Optionally, a respective one of the plurality of light shielding blocks is formed on a side of an active layer of the plurality of thin film transistors closer to the base substrate for shielding light from irradiating on the active layer. Optionally, the first part of the light shielding layer and the plurality of light shielding blocks are formed in a same layer using a same material and a single mask plate.

In some embodiments, the first part, the second part, the third part, and the plurality of light shielding blocks of the light shielding layer are formed in a same layer using a same material and a single mask plate.

Figure 16B:
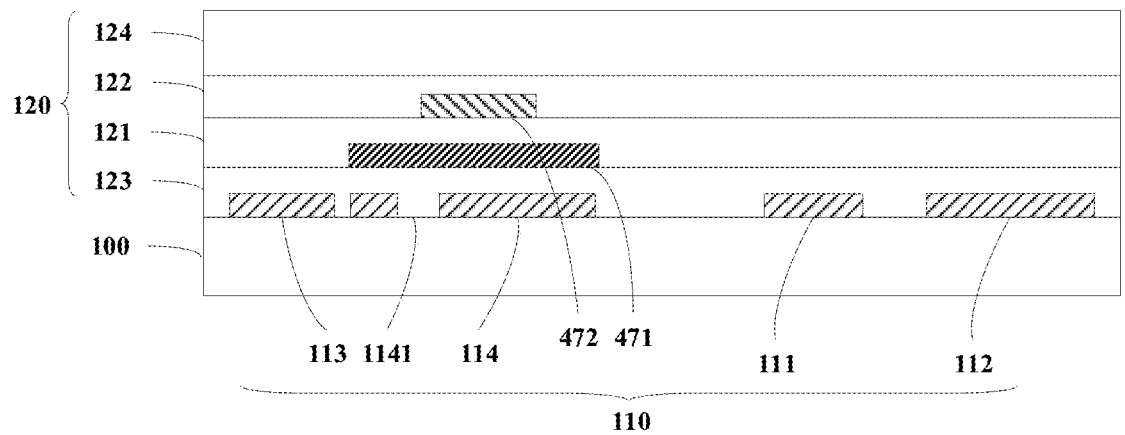
Figure 16C:
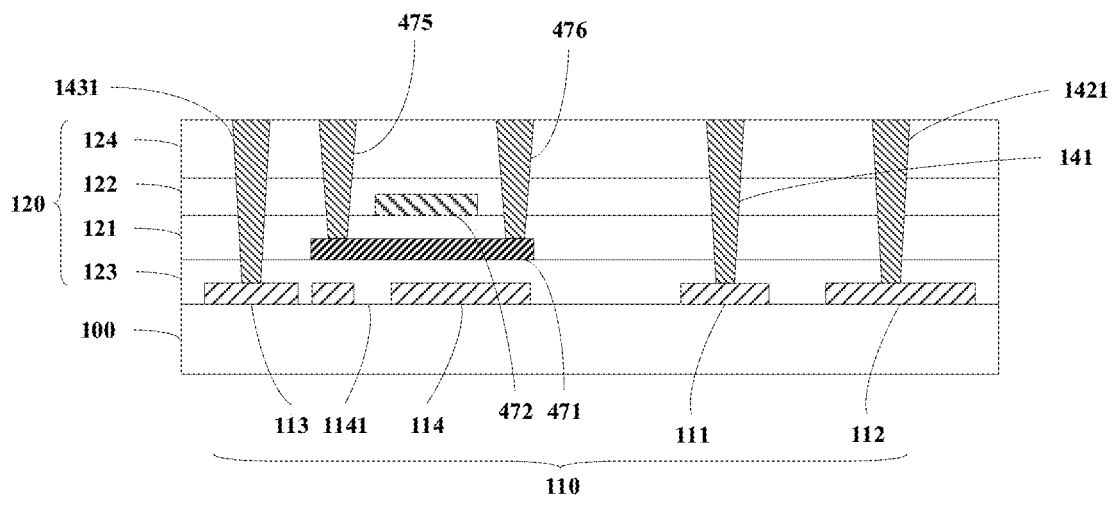
Figure 16D:
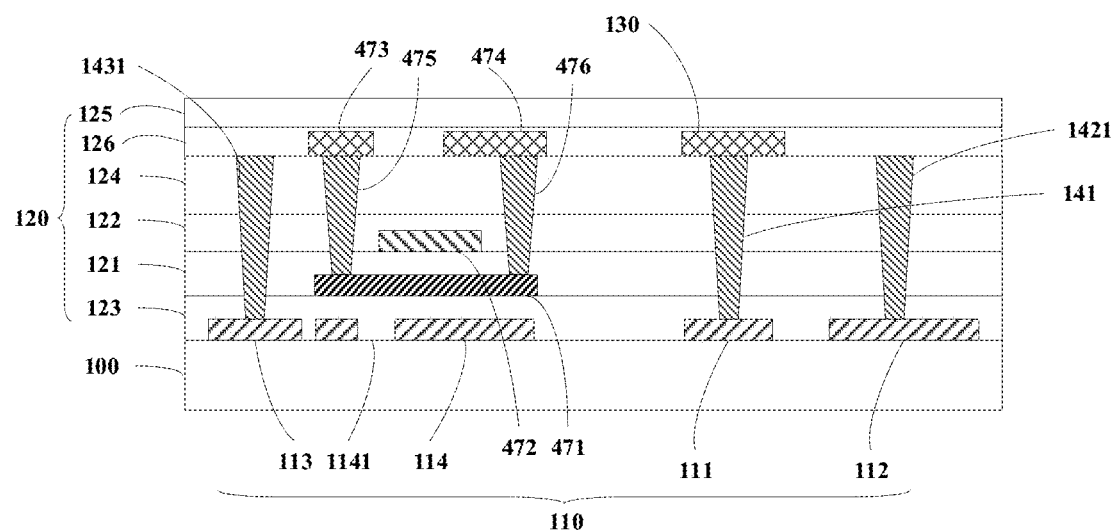
Figure 16E:
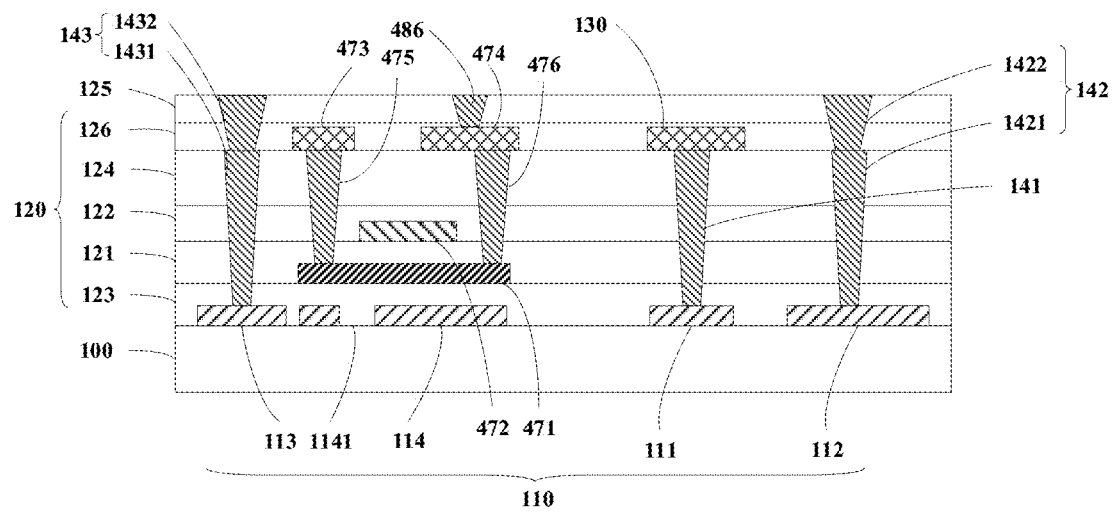
Figure 16F:
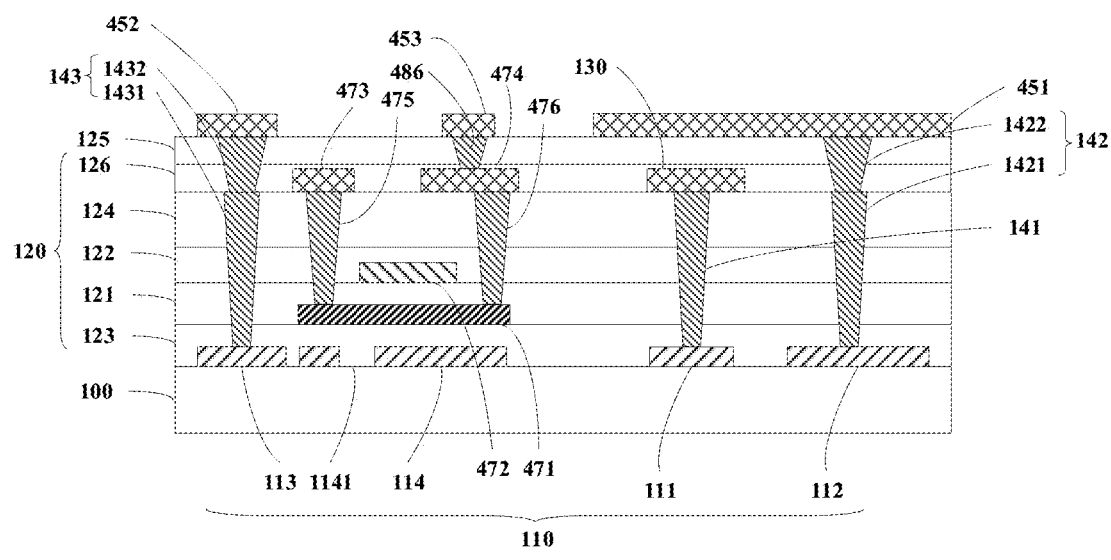

FIG. 16 to FIG. 16F are cross-sectional views of a display substrate illustrating a method of fabricating a display substrate in some embodiments according to present disclosure.

Referring to FIG. 16A, in some embodiments, a light shielding layer 110 is formed on the base substrate 100. In one example, the base substrate is a flexible base substrate. In another example, the base substrate is a rigid base substrate. Optionally, the light shielding layer 110 includes a first part 111, a second part 112, a third part 113, and a plurality of light shielding blocks 114.

For example, the first part 111 of the light shielding layer 110 is formed to be connected electrically in parallel with a GOA signal line. The second part 112 of the light shielding layer 110 is formed to be connected electrically in parallel with a first signal line. The third part 113 of the light shielding layer is formed to be connected electrically in parallel with a second signal line. A respective one of the plurality of light shielding blocks 114 is formed to be electrically connected to a respective one of the plurality of thin film transistors. Optionally, one of the plurality of light shielding blocks 114 includes an opening allowing light passing through to a photosensor for fingerprint detection.

Referring to FIG. 16B, in some embodiments, a buffer layer 123 is formed on a side of the light shielding layer 110 away from the base substrate 100 using processes including deposition. Subsequently, an active layer 471 is formed on a side of the buffer layer 123 using processes including Low Temperature Poly-silicon (LTPS). Subsequently, a first insulating layer 121 is formed on a side of the active layer 471 away from the base substrate using processes including deposition. Optionally, an orthographic projection of the first insulating layer 121 on the base substrate 100 covers an orthographic projection of the active layer 471 on the base substrate 100. Subsequently, a gate electrode 472 is formed on a side of the first insulating layer 121 away from the base substrate 100 using processes including deposition and patterning. Optionally, wherein an orthographic projection of the respective one of the plurality of light shielding blocks 114 on the base substrate covers an orthographic projection of the active layer 471 of the plurality of thin film transistors on the base substrate 100. Subsequently, a second insulating layer 122 is formed on a side of the gate electrode 472 away from the base substrate 100 using processes including deposition. Optionally, an orthographic projection of the second insulating layer 122 on the base substrate 100 covers the orthographic projection of the gate electrode 472 on the base substrate 100. Subsequently, an inter-layer dielectric layer 124 is formed on a side of the second insulating layer 122 away from the base substrate 100. By forming the buffer layer 123, the first insulating layer 121, the second insulating layer, and an inter-layer dielectric layer 124, the insulating layer 120 is formed.

Referring to FIG. 16C, in some embodiments, by using processes including photolithography, etching, and deposition, a plurality of first vias 141 are formed to extend through the insulating layer 120 and to expose a portion of the first part 111 of the light shielding layer 110; a plurality of fourth vias 475 are formed to extend through the insulating layer 120 and to expose a portion of the active layer 471; a plurality of fifth vias 476 are formed to extend through the insulating layer 120 and to expose a portion of the active layer 471; a first region 1421 of a respective one of the plurality of the second vias is formed to extend through the insulating layer 120 and to expose a portion of the second part 112 of the light shielding layer 110; and a second region 1431 of a respective one of the plurality of the third vias is formed to extending through the insulating layer 120 and to expose the third part 113 of the light shielding layer 110.

Referring to FIG. 16D, in some embodiments, a source electrode 473, a drain electrode 474, and a GOA signal line 130 is formed on a side of the inter-layer dielectric layer 124 using deposition and patterning. Optionally, the source electrode 473 is electrically connected to the active layer 471 through a respective one of the plurality of fourth vias 475. Optionally, the drain electrode 474 is electrically connected to the active layer 471 through a respective one of the plurality of fifth vias 476. Optionally, the GOA signal line 103 is electrically connected to the first part 111 of the light shielding layer 110 through the plurality of the first vias 141. For example, the GOA signal line 103 is connected electrically in parallel with the first part 111 of the light shielding layer 110 through at least two vias of the plurality of the first vias 141.

Subsequently, a planarization layer 125 is formed on side of the source electrode 473, the drain electrode 474, and the GOA signal line 130 away from the base substrate 100. Optionally, an orthographic projection of the planarization layer 125 on the base substrate 100 covers an orthographic projection of the source electrode 473, the drain electrode 474, and the GOA signal line 130. In some embodiments, the insulating layer 120 includes the buffer layer 123, the first insulating layer 121, the second insulating layer 122, the inter-layer dielectric layer 124, and the planarization layer 125.

In some embodiments, prior to forming the planarization layer 125, a passivation layer 126 is formed on a side of the source electrode 473, the drain electrode 474, and the GOA signal line 130 away from the base substrate 100. Subsequently, the planarization layer 125 is formed on a side of the passivation layer 126 away from the base substrate 100.

Referring to FIG. 16E, in some embodiments, a third region 1422 of a respective one of the plurality of the second vias 142, a fourth region 1432 of a respective one of the plurality of the third vias 143, and a respective one of the plurality of sixth vias 486 are formed to extending through the planarization layer 125, using the processes including photolithography, etching, and deposition. Optionally, the third region 1422 of a respective one of the plurality of the second vias 142, the fourth region 1432 of a respective one of the plurality of the third vias 143, and a respective one of the plurality of sixth vias 486 are formed to extending through the planarization layer 125 and the passivation layer 126. Optionally, the plurality of sixth vias 486 are formed to expose a portion of the drain electrode 474.

In one example, the third region 1422 of a respective one of the plurality of the second vias 142 is formed to be connected with the first region 1421 of the respective one of the plurality of the second vias 142 to form the respective one of the plurality of second vias 142. In another example, the fourth region 1432 of a respective one of the plurality of the third vias 143 is formed to be connected with the second region 1431 of the respective one of the plurality of the third vias 143 to form the respective one of the plurality of third vias 143.

In some embodiments, the plurality of second vias 142 can be formed subsequent to forming the planarization layer 125. For example, the plurality of second vias 142 is formed by etching the planarization layer 125, the inter-layer dielectric layer 124, the second insulating layer 122, the first insulating layer 121, and the buffer layer 123, to expose a portion of the second part 112 of the light shielding layer 110. Subsequently, a conductive material is filed into the plurality of second vias 142.

In some embodiments, the plurality of third vias 143 can be formed subsequent to forming the planarization layer 125. For example, the plurality of third vias 143 is formed by etching the planarization layer 125, the inter-layer dielectric layer 124, the second insulating layer 122, the first insulating layer 121, and the buffer layer 123, to expose a portion of the third part 113 of the light shielding layer 110. Subsequently, a conductive materials is filed into the plurality of third vias 143.

Referring to FIG. 16F, in some embodiments, a first signal line 451, a second signal line 452, a third signal line 453 are formed on a side of the planarization layer 125 away from the base substrate 100 using process including deposition and patterning. Optionally, the first signal line 451 is electrically connected to the second part 112 of the light shielding layer 110 through the plurality of second vias 142. For example, the first signal line 451 is connected electrically in parallel with the second part 112 of the light shielding layer 110 through at least two vias of the plurality of second vias 142. Optionally, the second signal line 452 is electrically connected to the third part 113 of the light shielding layer 110 through the plurality of third vias 143. For example, the second signal line 452 is connected electrically in parallel with the third part 113 of the light shielding layer 110 through at least two vias of the plurality of third vias 143. Optionally, the third signal line 453 is electrically connected to the drain electrode 474 through a respective one of the plurality of sixth vias 486.

By electrically connecting the GOA signal line 130 in parallel with the first part 111 of the light shielding layer 110, a resistance of a combination of the GOA signal line 130 and the first part 111 of the light shielding layer 110 is lower than a sum of the resistance of the GOA signal line 130 and the resistance of the first part 111 of the light shielding layer 110. By electrically connecting the first signal line 451 in parallel with the second part 112 of the light shielding layer 110, a resistance of a combination of the first signal line 451 and the second part 112 of the light shielding layer 110 is lower than a sum of the resistance of the first signal line 451 and the resistance of the second part 112 of the light shielding layer 110. By electrically connecting the second signal line 452 in parallel with the third part 113 of the light shielding layer 110, a resistance of a combination of the second signal line 452 and the third part 113 of the light shielding layer 110 is lower than a sum of the resistance of the second signal line 452 and the resistance of the third part 113 of the light shielding layer 110. A lower resistance may improve the display uniformity.

In some embodiments, the method includes forming a plurality of GOA signal lines on a base substrate and in the GOA area; and forming a first signal line in the GOA area, at least a portion of the first signal line being on a side of the plurality of GOA signal lines away from the base substrate. Optionally, forming the plurality of GOA signal lines comprises forming a first clock signal line, forming a second clock signal line, forming a start signal line, forming a high voltage power line, and forming a low voltage power line. Optionally, an orthographic projection of the first signal line on the base substrate at least partially covers (e.g., completely covers) an orthographic projection of at least one of the first clock signal line, the second clock signal line, the start signal line, the high voltage power line, or the low voltage power line on the base substrate.

In some embodiments, the method further includes forming a plurality of drive circuits in the GOA area. Optionally, forming the plurality of drive circuits comprise forming at least one of a gate drive circuit configured to transmit gate scanning signals to gate electrodes of data write transistors in a pixel driving circuits in a display area, a light emission control drive circuit configured to transmit light emission control signals to gate electrodes of light emission control transistors in the pixel driving circuits in the display area, and a reset control drive circuit configured to transmit reset control signals to reset transistors in the pixel driving circuits in the display area. Optionally, the orthographic projection of the first signal line on the base substrate at least partially covers (e.g., completely covers) an orthographic projection of the light emission control drive circuit on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a gate-on-array (GOA) area outside the display area, comprising:
   a base substrate;
   a plurality of GOA signal lines on the base substrate and in the GOA area;
   a first signal line in the GOA area, at least a portion of the first signal line being on a side of the plurality of GOA signal lines away from the base substrate;
   a light shielding layer on the base substrate;
   an insulating layer on a side of the light shielding layer away from the base substrate;
   a plurality of thin film transistors in the display area;
   a planarization layer on a side of the GOA signal line away from the base substrate; and a first signal line in the GOA area and on a side of the planarization layer away from the base substrate, and is connected electrically in parallel with a second part of the light shielding layer in the GOA area, the second part spaced apart from the first part;

wherein the plurality of GOA signal lines comprise a first clock signal line, a second clock signal line, a start signal line, a high voltage power line, and a low voltage power line;

an orthographic projection of the first signal line on the base substrate at least partially covers an orthographic projection of at least one of the first clock signal line, the second clock signal line, the start signal line, the high voltage power line, or the low voltage power line on the base substrate;

the GOA signal line is on a side of the insulating layer away from the light shielding layer, and is connected electrically in parallel with a first part of the light shielding layer, the first part being in the GOA area;

the display substrate comprises a plurality of first vias extending through the insulating layer in the GOA area;

the GOA signal line is electrically connected to the first part of the light shielding layer through the plurality of first vias respectively, thereby connecting the GOA signal line and the first part of the light shielding layer electrically in parallel;

the light shielding layer further comprises a plurality of light shielding blocks on the base substrate and in the display area, a respective one of the plurality of light shielding blocks on a side of an active layer of the plurality of thin film transistors closer to the base substrate for shielding light from irradiating on the active layer;

the first part of the light shielding layer and the plurality of light shielding blocks are in a same layer and comprise a same material;

the display substrate comprises a plurality of second vias extending through the insulating layer and the planarization layer in the GOA area; and the first signal line is electrically connected to the second part of the light shielding layer through the plurality of second vias respectively, thereby connecting the first signal line and the second part of the light shielding layer electrically in parallel.

2. The display substrate of claim 1, wherein the orthographic projection of the first signal line on the base substrate at least partially covers a combination of orthographic projections of the first clock signal line, the second clock signal line, the start signal line, the high voltage power line, and the low voltage power line on the base substrate.

3. The display substrate of claim 1, further comprising a plurality of drive circuits in the GOA area;

wherein the plurality of drive circuits comprise at least one of a gate drive circuit configured to transmit gate scanning signals to gate electrodes of data write transistors in a pixel driving circuits in a display area, a light emission control drive circuit configured to transmit light emission control signals to gate electrodes of light emission control transistors in the pixel driving circuits in the display area, and a reset control drive circuit configured to transmit reset control signals to reset transistors in the pixel driving circuits in the display area; and the orthographic projection of the first signal line on the base substrate at least partially covers an orthographic projection of the light emission control drive circuit on the base substrate.

4. The display substrate of claim 3, wherein the orthographic projection of the first signal line on the base substrate further at least partially covers an orthographic projection of the gate drive circuit on the base substrate.

5. The display substrate of claim 3, wherein the orthographic projection of the first signal line on the base substrate covers an orthographic projection of at least one light emission control shift register of the light emission control drive circuit on the base substrate.

6. The display substrate of claim 3, wherein the orthographic projection of the first signal line on the base substrate covers an orthographic projection of at least one light emission control shift register unit of the light emission control drive circuit on the base substrate, and covers an orthographic projection of at least one shift register unit of the gate drive circuit.

7. The display substrate of claim 6, wherein an orthographic projection of the respective one of the plurality of light shielding blocks on the base substrate covers an orthographic projection of the active layer of the plurality of thin film transistors on the base substrate.

8. The display substrate of claim 1, further comprising a plurality of pixel driving circuits, a respective pixel driving circuit of the plurality of pixel driving circuit comprising a thin film transistor, a planarization layer, and a relay electrode;

wherein the planarization layer is on a side of the thin film transistor away from the base substrate, covering the thin film transistor;

the relay electrode is on a side of the planarization layer away from the base substrate;

the thin film transistor comprises an active layer on the base substrate, a gate electrode on a side of the active layer away from the base substrate, a first electrode and a second electrode on a side of the gate electrode away from the base substrate, the relay electrode being electrically connected to one of the first electrode and the second electrode through a via extending through the planarization layer; and the first signal line is in a same layer as the relay electrode.

9. The display substrate of claim 1, comprising at least one opening in the second part of the light shielding layer.

10. The display substrate of claim 1, wherein the first part and the second part of the light shielding layer, and the plurality of light shielding blocks are in a same layer and comprise a same material.

11. The display substrate of claim 1, further comprising a second signal line in the display area and on a side of the planarization layer away from the base substrate, and is connected electrically in parallel with a third part of the light shielding layer in the display area, the third part spaced apart from the first part and spaced apart from the second part; and a plurality of third vias extending through the insulating layer and the planarization layer in the display area;

wherein the second signal line is electrically connected to the third part of the light shielding layer through the plurality of third vias respectively, thereby connecting the second signal line and the third part of the light shielding layer electrically in parallel.

12. The display substrate of claim 11, wherein the first part, the second part, and the third part of the light shielding layer, and the plurality of light shielding blocks are in a same layer and comprise a same material.

13. The display substrate of claim 11, wherein the second signal line is a ground voltage line.

14. The display substrate of claim 1, further comprising an opening in the respective one of the plurality of light shielding blocks allowing light passing through to a photosensor for fingerprint detection.

15. The display substrate of claim 1, wherein the first signal line is a power signal line.

16. The display substrate of claim 1, comprising at least one opening in the first part of the light shielding layer.

17. A display apparatus, comprising the display substrate of claim 1, and one or more integrated circuits connected to the display substrate.

\* \* \* \* \*